(12) United States Patent
Utsumi et al.

(10) Patent No.: US 11,408,065 B2
(45) Date of Patent: Aug. 9, 2022

(54) COATING

(71) Applicants: Sumitomo Electric Industries, Ltd., Osaka (JP); MIMSI MATERIALS AB, Linkoeping (SE)

(72) Inventors: Yoshiharu Utsumi, Itami (JP); Paer Christoffer Arumskog, Itami (JP); Keiichi Tsuda, Itami (JP); Konstantinos Sarakinos, Linkoeping (SE); Sankara Pillay, Linkoeping (SE); Daniel Gunnar Magnfaelt, Linkoeping (SE)

(73) Assignees: Sumitomo Electric Industries, Ltd., Osaka (JP); Mimsi Materials AB, Linkoeping (SE)

( * ) Notice: Subject to any disclaimer, the term of this patent is extended or adjusted under 35 U.S.C. 154(b) by 595 days.

(21) Appl. No.: 16/465,330

(22) PCT Filed: Dec. 28, 2016

(86) PCT No.: PCT/JP2016/089166
§ 371 (c)(1),
(2) Date: May 30, 2019

(87) PCT Pub. No.: WO2018/123042
PCT Pub. Date: Jul. 5, 2018

(65) Prior Publication Data
US 2019/0292649 A1 Sep. 26, 2019

(51) Int. Cl.
*C23C 14/06* (2006.01)
*C23C 28/00* (2006.01)
*C23C 28/04* (2006.01)

(52) U.S. Cl.
CPC .......... *C23C 14/0647* (2013.01); *C23C 14/06* (2013.01); *C23C 14/0617* (2013.01);
(Continued)

(58) Field of Classification Search
CPC ..... C23C 28/04; C23C 28/042; C23C 28/044; C23C 28/048; C23C 28/34;
(Continued)

(56) References Cited

U.S. PATENT DOCUMENTS 6,316,094 B1 * 11/2001 Fukaya ................... C22C 26/00
428/404
2004/0018393 A1 1/2004 Fukui et al.
(Continued)

FOREIGN PATENT DOCUMENTS

JP H06-279990 A 10/1994
JP H07-003432 A 1/1995
(Continued)

*Primary Examiner* — Z. Jim Yang
(74) *Attorney, Agent, or Firm* — Baker Botts L.L.P.; Michael A. Sartori

(57) ABSTRACT

At least one layer in a coating located on a surface of a substrate is a domain structure layer constituted of two or more domains different in composition and a thin layer located between the domains and being different in composition from each of the domains. The thin layer is located between any one domain and any another domain and in contact therewith. When the size of each of a plurality of first domains present in the domain structure layer is defined as a diameter of a virtual circumcircle in contact with each first domain, the average value of the size of each first domain is not smaller than 1 nm and not greater than 10 nm and a thickness of the thin layer in a direction of thickness of the domain structure layer is not less than 1 atomic layer and not more than 10 atomic layers.

18 Claims, 4 Drawing Sheets

(52) U.S. Cl.
CPC ............ *C23C 28/044* (2013.01); *C23C 28/40* (2013.01); *Y10T 428/161* (2015.01); *Y10T 428/163* (2015.01); *Y10T 428/164* (2015.01)

(58) Field of Classification Search
CPC ........ C23C 28/345–347; C23C 28/341; C23C 28/36; C23C 28/40–44; C23C 16/308; C23C 16/32–38; C23C 16/40–402; C23C 16/403; C23C 16/405; C23C 14/0641–0658; C23C 14/0664; C23C 14/0676; C03C 28/0641–0658; C03C 28/0664; C03C 28/0676; C04B 41/5062; C04B 41/5063; C04B 41/5064; C04B 41/5066; C04B 41/5067; C04B 41/5068; C04B 41/507
See application file for complete search history.

(56) References Cited

U.S. PATENT DOCUMENTS

| | | | | |
|---|---|---|---|---|
| 2005/0201921 | A1* | 9/2005 | Vetter | C23C 14/32 423/414 |
| 2006/0266442 | A1* | 11/2006 | Narayan | C23C 14/28 148/437 |
| 2007/0227297 | A1* | 10/2007 | Noda | C04B 35/58 75/238 |
| 2008/0318062 | A1* | 12/2008 | Endrino | C23C 14/0664 428/428 |
| 2009/0088325 | A1* | 4/2009 | Goyal | H01L 39/143 505/230 |
| 2011/0143054 | A1* | 6/2011 | Kurapov | C23C 14/0641 427/580 |
| 2012/0057612 | A1 | 3/2012 | Yoshida et al. | |
| 2014/0234616 | A1 | 8/2014 | Hultman et al. | |
| 2014/0322063 | A1* | 10/2014 | Miyashita | B22F 3/12 419/22 |
| 2015/0044428 | A1* | 2/2015 | Oh | C23C 16/403 156/247 |
| 2015/0194175 | A1* | 7/2015 | Chen | G11B 5/65 428/832 |
| 2015/0240347 | A1* | 8/2015 | Lehnert | C23C 14/0664 428/140 |
| 2016/0024962 | A1* | 1/2016 | Luthra | C23C 28/048 428/312.6 |
| 2016/0040285 | A1* | 2/2016 | Tatsuoka | C23C 16/36 407/119 |
| 2016/0340774 | A1* | 11/2016 | Sarakinos | C23C 14/28 |
| 2017/0021429 | A1* | 1/2017 | Paseuth | C23C 16/52 |
| 2017/0073276 | A1* | 3/2017 | Feigelson | C23C 16/4417 |
| 2017/0256677 | A1* | 9/2017 | Fujikura | H01L 33/22 |
| 2017/0320144 | A1* | 11/2017 | Nishibayashi | C23C 14/48 |
| 2018/0195161 | A1* | 7/2018 | Utsumi | C23C 14/0036 |
| 2019/0232381 | A1* | 8/2019 | Sato | B23B 51/00 |

FOREIGN PATENT DOCUMENTS

| | | |
|---|---|---|
| JP | 2001-293601 A | 10/2001 |
| JP | 2002-096205 A | 4/2002 |

* cited by examiner

COATING

TECHNICAL FIELD

The present disclosure relates to a coating located on a surface of a substrate.

BACKGROUND ART

In order to improve various characteristics of industrial products such as cutting tools, wear-resistant tools, molds, and electronic components, a coating having characteristic physical properties has conventionally been provided on a surface of such a substrate through vapor deposition.

Vapor deposition includes physical vapor deposition (PVD) or chemical vapor deposition (CVD). In particular, since a coating formed through PVD decreases the likelihood of a deterioration in strength of the substrate, it has widely been used for a cutting tool required to be high in strength, such as drills, end mills, and indexable inserts for milling, wear-resistant tools, and molds. In particular, demands for tools include adaptation to dry cutting without the use of a cutting fluid and higher cutting speed. In order to meet such demands, the coating provided on the surface of the substrate is required to have high hardness and good wear resistance.

For the purpose of improving the hardness and wear resistance of a coating, a coating in which a specific compound is stacked or combined on a scale as fine as a nanometer, thus having nanometer order, has been studied. For example, PTD 1 (Japanese Patent Laying-Open No. 07-003432) discloses a coating in which two or more types of layers each having a thickness on the order of nanometers are alternately stacked, and PTD 2 (Japanese Patent Laying-Open No. 06-279990), PTD 3 (Japanese Patent Laying-Open No. 2001-293601), and PTD 4 (Japanese Patent Laying-Open No. 2002-096205) each disclose a coating having a layer containing fine particles on the order of nanometers.

In such a coating which is a stack or combination on a scale as small as the nanometer order, a hardness of the coating itself tends to be high owing to nanometer size effect. Furthermore, strain energy is likely to be accumulated at an interface between compounds different in composition. Coatings in which strain energy is accumulated have been known to be high in hardness. That is, according to the conventional art, attempts to improve the hardness of a coating based on the nanometer size effect and accumulation of strain energy and to thereby improve wear resistance of the coating have been made.

CITATION LIST

Patent Document

PTD 1: Japanese Patent Laying-Open No. 07-003432
PTD 2: Japanese Patent Laying-Open No. 06-279990
PTD 3: Japanese Patent Laying-Open No. 2001-293601
PTD 4: Japanese Patent Laying-Open No. 2002-096205

SUMMARY OF INVENTION

A coating according to one manner of the present disclosure is a coating located on a surface of a substrate. The coating includes one or more layers, and at least one of the layers is a domain structure layer constituted of two or more domains different in composition and a thin layer different in composition from each of the domains. The thin layer is located between any one domain and any another domain and in contact therewith. A first domain which is one of the two or more domains and a second domain which is another one of the two or more domains are composed of at least one element selected from the group consisting of Al, B, Si, and elements of group 4, 5, 6 in the periodic table and at least one element selected from the group consisting of B, O, C, and N. The thin layer is composed of at least one element selected from B and Si and at least one element selected from B, O, C, and N. A plurality of first domains are present in the domain structure layer. When a size of each first domain in an in-plane direction of the domain structure layer is defined as a diameter of a virtual circumcircle in contact with each first domain, an average value of the size of each first domain is not smaller than 1 nm and not greater than 10 nm. A thickness of the thin layer in a direction of thickness of the domain structure layer is not less than 1 atomic layer and not more than 10 atomic layers.

MODE FOR CARRYING OUT THE INVENTION

Figure 1:
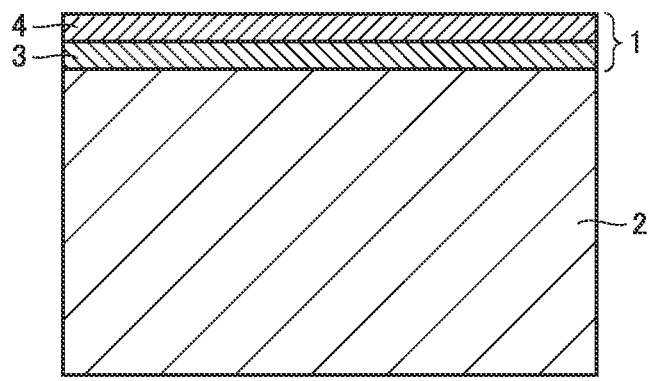
FIG. 1 is a cross-sectional view showing one example of a coating according to one embodiment of the present invention.

Problem to be Solved by the Present Disclosure

The conventional art still has a room for improvement in such physical properties as hardness and wear resistance. For example, in PTD 1, though a large number of crystal interfaces are present in the thickness direction, there is also a region where no crystal interface is present in the direction perpendicular to the thickness direction (the in-plane direction). That is, crystal interfaces present in the coating in PTD 1 extend only in one direction. Therefore, the degree of accumulation of strain energy is limited.

In PTDs 2 to 4, control of the extent of distribution of fine particles tends to be difficult and hence there may be a portion where fine particles identical in composition are adjacent to each other. In the portion where fine particles identical in composition are adjacent to each other, larger sized particles are apparently present and the nanometer size effect may not be obtained. In addition, since no strain energy is generated at the crystal interface where fine particles identical in composition are adjacent to each other, strain energy accumulated as a whole may be low.

An object of the present disclosure is to provide a coating excellent in hardness and wear resistance.

Effects of the Present Disclosure

According to the above, a coating excellent in hardness and wear resistance can be provided.

Description of Embodiments of the Present Invention

A manner of carrying out the present invention will initially be listed and described.

[1] A coating according to one manner of the present disclosure is a coating located on a surface of a substrate. The coating includes one or more layers, and at least one of the layers is a domain structure layer constituted of two or more domains different in composition and a thin layer different in composition from each of the domains. The thin layer is located between any one domain and any another domain and in contact therewith. A first domain which is one of the two or more domains and a second domain which is another one of the two or more domains are composed of at least one element selected from the group consisting of Al, B, Si, and elements of group 4, 5, 6 in the periodic table and at least one element selected from the group consisting of B, O, C, and N. The thin layer is composed of at least one element selected from B and Si and at least one element selected from B, O, C, and N. A plurality of first domains are present in the domain structure layer. When the size of each first domain in the in-plane direction of the domain structure layer is defined as a diameter of a virtual circumcircle in contact with each first domain, the average value of the size of each first domain is not smaller than 1 nm and not greater than 10 nm. A thickness of the thin layer in a direction of thickness of the domain structure layer is not less than 1 atomic layer and not more than 10 atomic layers.

Here, the expression "different in composition" herein means a concept including naturally a case that constituent elements do not completely match and also a case that elements completely match, although the content thereof is different. Therefore, for example, "AlN" and "TiN" are different in composition from each other, and "$Al_{0.6}Ti_{0.4}N$" and "$Al_{0.4}Ti_{0.6}N$" are also different in composition from each other. Strain energy is generated at an interface between such compositions different from each other.

According to the coating, the average value of the size of the first domain is not smaller than 1 nm and not greater than 10 nm. That is, in the domain structure layer, the first domain has a nanometer size. The thin layer is present between the first domain and the second domain. Therefore, the domain structure layer can exhibit a great nanometer size effect, and high strain energy is accumulated owing to presence of a large number of interfaces between the first domain and the thin layer and interfaces between the second domain and the thin layer. In particular, a thickness of the thin layer in the direction of thickness of the domain structure layer is extremely small, that is, not less than one atomic layer and not more than 10 atomic layers. Therefore, strain owing to a difference in lattice constant between the first domain and the second domain is not relaxed and hence high strain energy can be accumulated in the domain structure layer. Furthermore, with presence of the thin layer between the first domain and the second domain, in a high-temperature environment, mutual diffusion between an element forming the first domain and an element forming the second domain is suppressed. Therefore, the coating can maintain a sufficiently high hardness and hence exhibit excellent wear resistance also in an environment at a higher temperature as compared with a conventional coating. Therefore, the domain structure layer can be excellent in hardness and wear resistance.

[2] In the coating in [1], the thin layer is preferably located between every pair of domains adjacent and different in composition, as being in contact with each of two types of adjacent domains. Thus, mutual diffusion of elements among all domains can be suppressed.

[3] In the coating in [1] and [2], 95% or more of the first domains may have a size in a range of not more than ±25% of the average value of the size. As the first domain has a uniform nanometer size, a greater nanometer size effect can be exhibited.

[4] In the coating in [1] to [3], when a nearest neighbor distance of each first domain in the in-plane direction of the domain structure layer is defined as a length of a shortest straight line connecting a center of the circumcircle with a center of another circumcircle adjacent to the circumcircle, an average value of the nearest neighbor distance of each first domain can be not smaller than 1 nm and not greater than 15 nm, and 95% or more of the first domains can have a nearest neighbor distance in a range of not more than ±25% of the average value of the nearest neighbor distance. In this case, the first domains are uniformly distributed and the second domains also have a nanometer size in a region between adjacent first domains. Therefore, the second domain can also exhibit the nanometer size effect.

[5] In the coating in [1] to [4], the domain structure layer may be constituted of the first domain, the second domain, and the thin layer. In this case as well, the effect above can be achieved.

[6] In the coating in [1] to [5], one of the first domain and the second domain may be composed of a nitride containing at least Al but not containing Ti and the other of the first domain and the second domain may be composed of a nitride containing at least Al and Ti. A nitride containing at least Al and Ti is excellent in hardness and oxidation resistance. Though a nitride containing at least Al but not containing Ti is lower in hardness than the nitride containing Al and Ti, it is superior in oxidation resistance because it contains no Ti. Therefore, since domains constituting the domain structure layer in this case are composed of the nitride containing Al and Ti excellent in hardness and oxidation resistance and the nitride containing Al which is poorer in hardness but better in oxidation resistance, they can have a hardness and oxidation resistance higher than those of a layer composed of any one nitride.

[7] In the coating in [6], one of the first domain and the second domain can be composed of AlN and the other of the first domain and the second domain can be composed of $Al_xTi_{1-x}N$, where the atomic ratio Al/Ti between Al and Ti in $Al_xTi_{1-x}N$ is not lower than 1 and not higher than 1.5. In this case, the effect the same as above is obtained and more inexpensive manufacturing can be achieved due to lower material cost.

[8] In the coating in [1] to [5], one of the first domain and the second domain may be composed of a nitride containing at least Al but not containing Ti and the other of the first domain and the second domain may be composed of a nitride containing at least Ti but not containing Al. Such a domain structure layer has composition similar to the nitride containing Al and Ti as the entire domain structure layer. Therefore, according to the coating, a high hardness and high oxidation resistance specific to the nitride containing Al and Ti can be achieved.

[9] In the coating in [8], one of the first domain and the second domain can be composed of AlN and the other of the first domain and the second domain can be composed of TiN. In this case, the effect the same as above is obtained and more inexpensive manufacturing can be achieved due to lower material cost.

[10] In the coating in [1] to [9], preferably, the atomic ratio Al/Ti between Al and Ti in the entire domain structure layer exceeds 1.5. Since the nitride containing Al and Ti tends to be excellent in hardness and oxidation resistance as the Al/Ti ratio in the entire coating is higher, the coating including such a domain structure layer can have a higher hardness and higher oxidation resistance.

[11] In the coating in [1] to [5], preferably, the first domain and the second domain are composed of a nitride containing at least Al and Ti, and the atomic ratio Al/Ti between Al and Ti in one of the first domain and the second domain is not lower than 1 and the atomic ratio Al/Ti between Al and Ti in the other of the first domain and the second domain is lower than 1. Such a domain structure layer has composition similar to the nitride containing Al and Ti as the entire domain structure layer. Therefore, according to the coating, in addition to the effect described above, a high hardness and high oxidation resistance specific to the nitride containing Al and Ti can further be achieved.

[12] In the coating in [1] to [11], the first domain, second domain, and the thin layer are preferably crystalline. In this case, since high strain energy owing to mismatch in crystal lattice (difference in lattice constant) between the first domain and the thin layer and mismatch in crystal lattice between the second domain and the thin layer is generated, the hardness of the coating can further be higher. Being crystalline is a concept encompassing both single crystals and polycrystals.

[13] In the coating in [1] to [12], the first domain, the second domain, and the thin layer preferably have crystal structure of a cubic NaCl type. In this case, since the hardness of each of the first domain, the second domain, and the thin layer is high, the hardness of the coating can consequently be even higher.

[14] In the coating in [1] to [13], the thin layer is preferably composed of SiN. Since solid solution of SiN with the first domain and the second domain is less likely, mutual diffusion between an element forming the first domain and an element forming the second domain in a high-temperature environment is effectively suppressed.

[15] In the coating in [1] to [13], the thin layer is preferably composed of BN. Since solid solution of BN with the first domain and the second domain is less likely, mutual diffusion between an element forming the first domain and an element forming the second domain in a high-temperature environment is effectively suppressed.

[16] In the coating in [1] to [15], a plurality of second domains are present in the domain structure layer, and when the size of each second domain in the in-plane direction of the domain structure layer is defined as the diameter of a virtual circumcircle in contact with each second domain, the average value of the size of each second domain is not smaller than 1 nm and not greater than 10 nm. In this case, a greater effect resulting from the nanometer order is obtained and strain energy is also higher.

[17] In the coating in [1] to [16], preferably, 95% or more of the second domains has a size in a range of not more than ±25% of the average value of the size. As the second domains have a uniform nanometer size, a greater nanometer size effect can be exhibited.

[18] In the coating in [1] to [17], when a nearest neighbor distance of each second domain in the in-plane direction of the domain structure layer is defined as a length of a shortest straight line connecting a center of the circumcircle with a center of another circumcircle adjacent to the circumcircle, preferably, an average value of the nearest neighbor distance of each second domain is not smaller than 1 nm and not greater than 15 nm, and 95% or more of the second domains has a nearest neighbor distance in a range of not more than ±25% of the average value of the nearest neighbor distance. In this case, since the second domains are uniformly distributed in the domain structure layer, a greater nanometer size effect can be exhibited.

Details of Embodiments of the Present Invention

One embodiment of the present invention (hereinafter also denoted as the "present embodiment") will be described hereinafter, however, the present embodiment is not limited thereto.

An expression in a form "A to B" herein means the upper limit and the lower limit of the range (that is, not less than A and not more than B). When a unit for A is not given and a unit is given only for B, the unit for A and the unit for B are the same. When a compound is herein expressed with a chemical formula such as AlN and when the atomic ratio is not particularly limited, all conventionally known atomic ratios are encompassed and a compound is not necessarily limited only to a compound within a stoichiometric range.

First Embodiment: Coating

FIG. 1 is a cross-sectional view showing one example of a coating according to the present embodiment. Referring to FIG. 1, a coating 1 is provided on a surface of a substrate 2. A shape of substrate 2 is not particularly limited and the material therefor is not particularly limited either. For example, when substrate 2 is a base for a cutting tool, a material which can withstand cutting resistance such as cemented carbide, steel, cermet, ceramics, and a diamond sintered material can suitably be employed.

Coating 1 includes one or more layers, and at least one of the layers is a domain structure layer constituted of two or more domains different in composition and a thin layer located between the domains and being different in composition from the domains. The number of layers in coating 1 is not particularly limited and the position of the domain structure layer is not particularly limited either. Coating 1 according to the present embodiment has such a construction that an underlying layer 3 and a domain structure layer 4 are stacked in this order as seen from the substrate 2.

Though the thickness of coating 1 is not particularly limited either, coating 1 preferably has a thickness from 0.1 to 10 μm, for example, when substrate 2 is the base for a tool.

[Domain Structure Layer]

Figure 2:
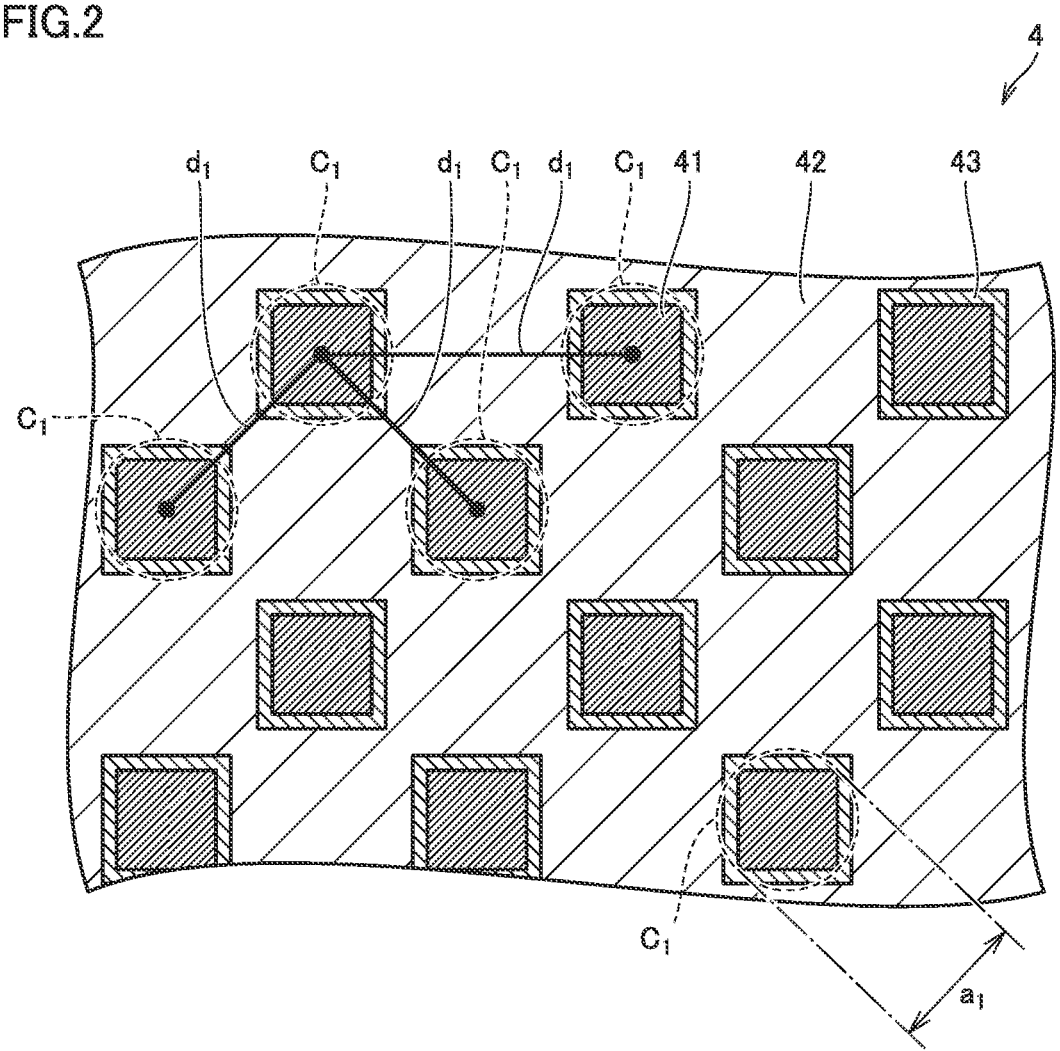
FIG. 2 is a cross-sectional view schematically showing a construction of any cross-section in an in-plane direction of a domain structure layer by way of example.

FIG. 2 is a cross-sectional view schematically showing a construction of any cross-section in the in-plane direction of the domain structure layer by way of example. The in-plane direction of the domain structure layer means the direction orthogonal to the thickness direction of the domain structure layer.

Referring to FIG. 2, domain structure layer 4 is constituted of a first domain 41, a second domain 42, and a thin layer 43. First domain 41, second domain 42, and thin layer 43 are different in composition from one another. In the present embodiment, a plurality of first domains 41 are present in domain structure layer 4, and second domain 42 is continuously present to surround each first domain 41. Thin layer 43 is located between first domain 41 and second domain 42 as being in contact with both of them. That is, domain structure layer 4 in the present embodiment has what is called a sea-island structure.

In the present embodiment, for facilitating understanding, first domain 41 is shown to have a square shape and second domain 42 is shown to have a shape surrounding a plurality of squares, however, a shape of first domain 41 and second domain 42 is not particularly limited and their shape may vary. A shape of thin layer 43 is not particularly limited either, and it should only be located between first domain 41 and second domain 42, that is, between the domains, as being in contact with both of them. In particular, thin layer 43 is preferably located between every pair of domains. In this case, first domain 41 and second domain 42 are not in contact with each other.

First domain 41 and second domain 42 are composed of at least one element selected from the group consisting of Al, B, Si, and elements of group 4 (Ti, Zr, Hf), 5 (V, Nb, Ta), and 6 (Cr, Mo, W) in the periodic table and at least one element selected from the group consisting of B, O, C, and N. When the former group includes B, the latter group does not include B. That is, when B grouped in the former group representing a group of metal elements is included in each composition, B grouped in the latter group representing a group of non-metal elements cannot be included, and when B grouped in the latter group is included, B grouped in the former group cannot be included. First domain 41 and second domain 42 may contain an inevitable impurity.

Thin layer 43 is composed of at least one element selected from B and Si and at least one element selected from B, O, C, and N. When the former group includes B, the latter group does not include B. That is, when B grouped in the former group representing a group of metal elements is included in each composition, B grouped in the latter group representing a group of non-metal elements cannot be included, and when B grouped in the latter group is included, B grouped in the former group cannot be included. Thin layer 43 may contain an inevitable impurity.

A compound composed as such is excellent in wear resistance, oxidation resistance, and high-temperature stability. Therefore, domain structure layer 4 having first domain 41, second domain 42, and thin layer 43 composed as above is suitable for cutting tools, wear-resistant tools, and molds. The composition of each domain and thin layer 43 can be confirmed by evaluating a cross-section of domain structure layer 4 with a transmission electron microscope equipped with an energy dispersive X-ray spectrometer or three-dimensional atom probe tomography.

Each of a plurality of first domains 41 has a size and the nearest neighbor distance. Herein, the size of first domain 41 is defined as the diameter of a virtual circumcircle in contact with first domain 41, and the nearest neighbor distance of first domain 41 is defined as the shortest straight line between the center of the virtual circumcircle in contact with first domain 41 and the center of another virtual circumcircle adjacent to the circumcircle. Specifically, each value is determined as follows.

Referring to FIG. 2, initially, any cross-section in the in-plane direction of domain structure layer 4 is evaluated with a transmission electron microscope or three-dimensional atom probe tomography. Domains and thin layer 43 different in composition can thus be distinguished from one another. Then, a virtual circumcircle $C_1$ is drawn for a plurality of first domains 41, constituting the island structure, of the measured domains. The diameter $a_1$ of each virtual circumcircle $C_1$ is defined as the size of each first domain 41. In addition, each straight line $d_1$ between the central point of virtual circumcircle $C_1$ in one first domain 41 and the central point of virtual circumcircle $C_1$ in each of other plurality of first domains 41 adjacent to that one first domain 41 is measured. The shortest of these straight lines $d_1$ is defined as the nearest neighbor distance of that one first domain 41.

Domain structure layer 4 in the present embodiment is characterized by satisfying (1) and (2) below.

(1) The average value of the size of first domain 41 is from 1 to 10 nm.

(2) A thickness of thin layer 43 in a direction of thickness of domain structure layer 4 is from 1 to 10 atomic layers.

In connection with (1), the "average value of the size of first domain 41" means the average value of diameters $a_1$ of at least 100 virtual circumcircles $C_1$. Though the size at which a hardness of first domain 41 is highest owing to the effect resulting from the nanometer order is different depending on composition of first domain 41, a sufficiently high hardness can be exhibited so long as the average value of the size of first domains 41 is at least within the range above.

In connection with (2), a thickness of thin layer 43 in the direction of thickness of domain structure layer 4 can be measured as follows. Initially, a measurement sample including a cross-section in parallel to the direction of thickness of domain structure layer 4 is prepared. Then, a position of thin layer 43 is specified by evaluating the measurement sample with an energy dispersive X-ray spectrometer equipped in a transmission electron microscope or three-dimensional atom probe tomography. Then, the number of atomic layers forming thin layer 43 is counted in a lattice image resulting from observation of thin layer 43 with the use of a high resolution transmission electron microscope.

Since thin layer 43 is thus extremely thin, relaxation of strain owing to a difference in lattice constant between first domain 41 and second domain 42 by thin layer 43 is suppressed. Therefore, consequently, domain structure layer 4 can accumulate high strain energy. Thin layer 43 having a thickness, for example, of "10 atomic layers" means that a shortest distance from the interface with first domain 41 to the interface with second domain 42 in thin layer 43 interposed between first domain 41 and second domain 42 is comparable to 10 atomic layers.

Domain structure layer 4 in the present embodiment can achieve the following effect by satisfying (1) and (2) above. Firstly, since first domain 41 has a nanometer size, a nanometer size effect can be exhibited. High strain energy is accumulated owing to presence of a large number of interfaces between first domain 41 and thin layer 43 and interfaces between second domain 42 and thin layer 43. In particular, since a thickness of thin layer 43 in the direction of thickness of domain structure layer 4 is extremely small, strain owing to a difference in lattice constant between first domain 41 and second domain 42 is not relaxed and hence high strain energy can be accumulated in domain structure layer 4. Furthermore, since first domain 41 and second domain 42 are isolated from each other by thin layer 43, mutual diffusion between an element forming first domain 41 and an element forming second domain 42 in a high-temperature environment is suppressed. Therefore, the coating can maintain a sufficiently high hardness and can exhibit excellent wear resistance even in an environment at a higher temperature as compared with a conventional coating. Therefore, the domain structure layer can be excellent in hardness and wear resistance.

In contrast, when domain structure layer 4 does not satisfy (1) above, for example, when the average value of the size of first domains 41 is smaller than 1 nm, domain structure layer 4 exhibits a physical property as if it were composed of a single solid solution. Then, the nanometer size effect is not exhibited and the hardness is lower. Alternatively, when the average value of the size of first domains 41 is greater than 10 nm, the nanometer size effect is significantly lower. The average value of the size of first domains 41 is preferably from 1 to 5 nm and further preferably from 2 to 5 nm.

When domain structure layer 4 does not satisfy (2) above, for example, when thin layer 43 has a thickness smaller than one atomic layer, no thin layer exists, and mutual diffusion between an element forming first domain 41 and an element forming second domain 42 cannot be suppressed. Alternatively, when thin layer 43 has a thickness greater than 10 atomic layers, presence of thin layer 43 relaxes strain, which is not desirable. A more desirable range of the thickness of thin layer 43 is from 4 to 8 atomic layers. Though a value for a thickness in the in-plane direction of domain structure layer 4 is not particularly restricted, it tends to be equal or similar to a thickness in the direction of thickness in terms of a manufacturing method which will be described later.

In addition to (1) and (2) above, domain structure layer 4 in the present embodiment preferably satisfies at least one of (3) and (4) below.

(3) Ninety-five percent or more of first domains 41 has a size in the range of not more than ±25% of the average value of the size.

(4) The average value of the nearest neighbor distance of first domain 41 is from 1 to 15 nm and 95% or more of first domains 41 has a nearest neighbor distance in the range of not more than ±25% of the average value of the nearest neighbor distance.

In connection with (3), for example, when the average value of the size of 100 first domains 41 is 10 nm, 95 or more first domains 41 have the size within the range from 7.5 to 12.5 nm. That is, a plurality of first domains 41 are uniform in size.

In connection with (4), the "average value of the nearest neighbor distance of first domain 41" means the average value of the nearest neighbor distances of at least 100 first domains 41. From the difference between the average value of the size of first domain 41 and the average value of the nearest neighbor distance of first domain 41, it can be seen that the width of second domain 42 present between first domains 41 is on the nanometer order. The average value of the nearest neighbor distance is not smaller than the average value of diameter $a_1$.

"Being in the range of not more than ±25% of the average value of the nearest neighbor distance" means that, when the nearest neighbor distance, for example, of 100 first domains 41 is 10 nm, 95 or more first domains 41 have the nearest neighbor distance within the range from 7.5 to 12.5 nm. That is, a plurality of first domains 41 are uniformly distributed.

When domain structure layer 4 satisfies (3) above, first domain 41 has a uniform nanometer size and hence a great nanometer size effect can be exhibited. When domain structure layer 4 satisfies (4), first domains 41 are uniformly distributed, and therefore the conventional problem caused by adjacent particles is suppressed and hence lowering in hardness thereby can be suppressed. Since first domains 41 are uniformly distributed, much strain energy can be accumulated. Furthermore, since both of first domain 41 and second domain 42 present between first domains 41 are of the nanometer order, more interfaces are present within domain structure layer 4 and hence more strain energy resulting from presence of the interfaces can be accumulated. In particular, when domain structure layer 4 satisfies (3) and (4) above, first domains 41 have a uniform nanometer size and are uniformly distributed, and in addition, the second domains also have a nanometer size. Therefore, the effect above can synergistically be exhibited.

When domain structure layer 4 does not satisfy (3) above, for example, when deviation exceeds ±25%, first domain 41 low in hardness increases and consequently increase in hardness of domain structure layer 4 may be insufficient, because improvement in hardness owing to the nanometer size effect attains to a relative maximum value at a specific value (which is different depending on composition). Ninety-five percent or more of first domains 41 preferably has a size within the range of not more than ±15% from the average value of the size.

When domain structure layer 4 does not satisfy (4) above, for example, when the average value of the nearest neighbor distance of first domains 41 is greater than 15 nm, the total number of first domains 41 distributed in domain structure layer 4 is small or the size of second domain 42 present between first domains 41 is excessively large, and consequently a degree of accumulation of strain energy may be insufficient. The average value of the nearest neighbor distance of first domains 41 is preferably from 2 to 12 nm and further preferably from 2 to 10 nm.

When domain structure layer 4 does not satisfy (4) above, a portion where first domains 41 are continuous (with thin layer 43 being interposed) tends to be present. Since strain energy is generated at an interface between compounds different in composition, no strain energy is accumulated in a portion where first domains 41 are adjacent to each other with thin layer 43 being interposed, as compared with a portion where first domain 41 and second domain 42 are adjacent to each other with thin layer 43 being interposed. Ninety-five percent or more of first domains 41 preferably has the nearest neighbor distance within the range of not more than ±15% from the average value of the nearest neighbor distance.

In domain structure layer 4 in the present embodiment described above, each of first domain 41, second domain 42, and thin layer 43 may be crystalline or amorphous. In any of the cases of first domain 41, second domain 42, and thin layer 43 all being amorphous, some of first domain 41, second domain 42, and thin layer 43 being amorphous and the rest being crystalline, and first domain 41, second domain 42, and thin layer 43 all being crystalline, the nanometer size effect can be achieved in domain structure layer 4 so long as composition is different among them. Since strain energy is accumulated owing to mismatch in crystal lattice, each of first domain 41, second domain 42, and thin layer 43 is preferably crystalline.

When each of first domain 41, second domain 42, and thin layer 43 is crystalline, the compositions of first domain 41, second domain 42, and thin layer 43 are suitably combinations of a composition composed of an element having crystal structure other than a cubic NaCl type at room temperature and atmospheric pressure (composition A) and a composition composed of an element having crystal structure of the cubic NaCl type at room temperature and atmospheric pressure (composition B).

In this case, since the domain having composition A is of the nanometer order and thin layer 43 is extremely thin, the crystal structure of composition A can change to the crystal structure of the cubic NaCl type under the influence by the crystal structure of composition B. Therefore, while all crystal structures of first domain 41, second domain 42, and thin layer 43 are of the cubic NaCl type in domain structure layer 4, high strain energy with change in crystal structure is accumulated and hence a hardness of domain structure layer 4 is further improved. Since the crystal structure of the cubic NaCl type tends to be higher in hardness than other crystal structures, it is excellent also in this regard. The crystal structure of each domain and thin layer 43 can be confirmed, for example, with a nanobeam electron diffraction method using a transmission electron microscope and with a high resolution transmission electron microscope.

In particular, when one of first domain 41 and second domain 42 has composition A, the other thereof has composition B, and thin layer 43 has composition A, crystal structures of two portions change from the crystal structure other than the cubic NaCl type to the NaCl type crystal structure and hence higher strain energy can be accumulated in domain structure layer 4. In the present embodiment, since first domain 41 is of the nanometer order, preferably, first domain 41 and thin layer 43 have composition A and second domain 42 has composition B. In a second embodiment which will be described later, any of first domain 41 and second domain 42 may have composition A.

In coating 1 in the present embodiment, domain structure layer 4 is preferably composed of a nitride containing at least Al and Ti as a whole. Since the nitride containing Al and Ti is excellent in balance among a hardness, oxidation resistance, toughness, and non-reactivity with iron, coating 1 having domain structure layer 4 is suitable as a coating provided on a surface of a cutting tool, a wear-resistant tool, and a mold.

Since the nitride containing Al and Ti tends to be better in hardness and oxidation resistance as the Al/Ti ratio is higher, the Al/Ti ratio in the entire domain structure layer 4 composed of the nitride containing Al and Ti is preferably high. In domain structure layer 4, a high Al/Ti ratio can be realized using a combination of compositions of each domain. In particular, according to domain structure layer 4 in the present embodiment, the Al/Ti ratio in the entire domain structure layer 4 can also exceed 1.5. Though the upper limit of the Al/Ti ratio is not particularly restricted, it is set to 9.0 in view of manufacturing.

The high Al/Ti ratio as described above is a value which cannot be achieved by a conventional AlTiN solid solution. In the AlTiN solid solution, when the Al/Ti ratio exceeds 1.5, Al can no longer be dissolved in a solid state in the AlTiN solid solution and Al tends to be segregated as AlN (w-AlN) having crystal structure of a hexagonal wurtzite type or amorphous AlN (a-AlN). Since w-AlN and a-AlN have a lower hardness than the AlTiN solid solution, segregation thereof in the AlTiN solid solution leads to lowering of the hardness of the coating.

In domain structure layer 4 composed of the nitride containing Al and Ti, for the purpose of improvement in hardness and oxidation resistance, at least one element (except for Ti) selected from the group consisting of B, Si, and elements of group 4, 5, and 6 in the periodic table may be added as an additional element. Such an additional element may be substituted with Al or Ti or may form a solid solution as being introduced in between lattices. The atomic ratio of each additional element to the total amount of metal elements (the total amount of Al, Ti, and the additional element) is preferably not higher than 0.1 in the entire domain structure layer 4 and preferably not higher than 0.05 in each domain.

In domain structure layer 4 composed of the nitride containing Al and Ti described above, for example, one of first domain 41 and second domain 42 may be composed of a nitride containing Al but not containing Ti and the other may be composed of a nitride containing Al and Ti. In this case, since the high Al/Ti ratio in the entire domain structure layer 4 can be realized, a high hardness and high oxidation resistance can be achieved. Since first domain 41 and second domain 42 are significantly different in composition from each other, strain energy at an interface therebetween with thin layer 43 being interposed can be increased and hence a hardness of domain structure layer 4 is improved.

When a domain composed of the nitride containing Al and Ti satisfies composition B above and a domain composed of the nitride containing Al but not containing Ti satisfies composition A above, accumulation of strain energy with change in crystal structure of the domain made of composition A can also be achieved. As domain structure layer 4 satisfying this condition, a case that one of first domain 41 and second domain 42 is composed of AlN and the other is composed of $Al_xTi_{1-x}N$ can be mentioned. In this case, the Al/Ti ratio in the domain composed of the nitride containing Al and Ti is preferably from 1 to 1.5. When the ratio is lower than 1, the Al/Ti ratio of the entire domain structure layer is unfavorably low, and when the ratio is higher than 1.5, this tends to cause the unfavorable segregation of w-AlN or a-AlN within the domains.

In domain structure layer 4 composed of the nitride containing Al and Ti, one of first domain 41 and second domain 42 may be composed of a nitride containing Al but not containing Ti and the other may be composed of a nitride containing Ti but not containing Al. In this case as well, since domain structure layer 4 can realize the high Al/Ti ratio in the entire domain structure layer 4, a high hardness and high oxidation resistance can be achieved. Since first domain 41 and second domain 42 are significantly different in composition from each other, strain energy at an interface therebetween with thin layer 43 being interposed can be increased and hence a hardness of domain structure layer 4 is improved.

When a domain composed of the nitride containing Ti but not containing Al satisfies composition B above and a domain composed of the nitride containing Al but not containing Ti satisfies composition A above, accumulation of strain energy with change in crystal structure of the domain composed of composition A can also be achieved. As domain structure layer 4 satisfying this condition, a case that one of first domain 41 and second domain 42 is composed of AlN and the other is composed of TiN can be mentioned.

In domain structure layer 4 composed of the nitride containing Al and Ti, first domain 41 and second domain 42 may be composed of a nitride containing at least Al and Ti, the Al/Ti ratio of one of first domain 41 and second domain 42 may be not lower than 1, and the Al/Ti ratio of the other may be lower than 1. In this case, as compared with the case described above (a case that one is composed of AlN and the other is composed of TiN), both domains are composed of the nitride containing Al and Ti and hence the entire domain structure layer is also excellent in both characteristics of a hardness and oxidation resistance. In this case, however, from a point of view of prevention of segregation described above, the Al/Ti ratio is preferably not higher than 1.5.

In domain structure layer 4 composed of the nitride containing Al and Ti, first domain 41 or second domain 42 may naturally contain an additional element described above.

[Underlying Layer]

In the present embodiment, underlying layer 3 is preferably a solid solution layer composed of a solid solution. For example, when substrate 2 is composed of a sintered material composed of several different materials such as cemented carbide, a more homogenous domain structure layer 4 is obtained by providing a solid solution layer on the surface of the sintered material. This may be because, when domain structure layer 4 is provided directly on the surface of the sintered material, uniformity of domain structure layer 4 may be disturbed as affected by the sintered material. The solid solution preferably contains all elements forming domain structure layer 4. In this case, adhesiveness between domain structure layer 4 and the solid solution layer is further improved.

In the present embodiment described above in detail, a case that domain structure layer 4 is constituted of first domain 41, second domain 42, and thin layer 43 has been described, however, the construction of domain structure layer 4 is not limited thereto. For example, the domain structure layer may be constituted of three types of domains different in composition from one another or four types of domains different in composition from one another.

Though the size of first domain 41 and the nearest neighbor distance of first domain 41 are determined in any cross-section in the in-plane direction of domain structure layer 4 in the present embodiment, similar conditions are preferably satisfied also in any cross-section in the direction of thickness of domain structure layer 4.

Figure 3:
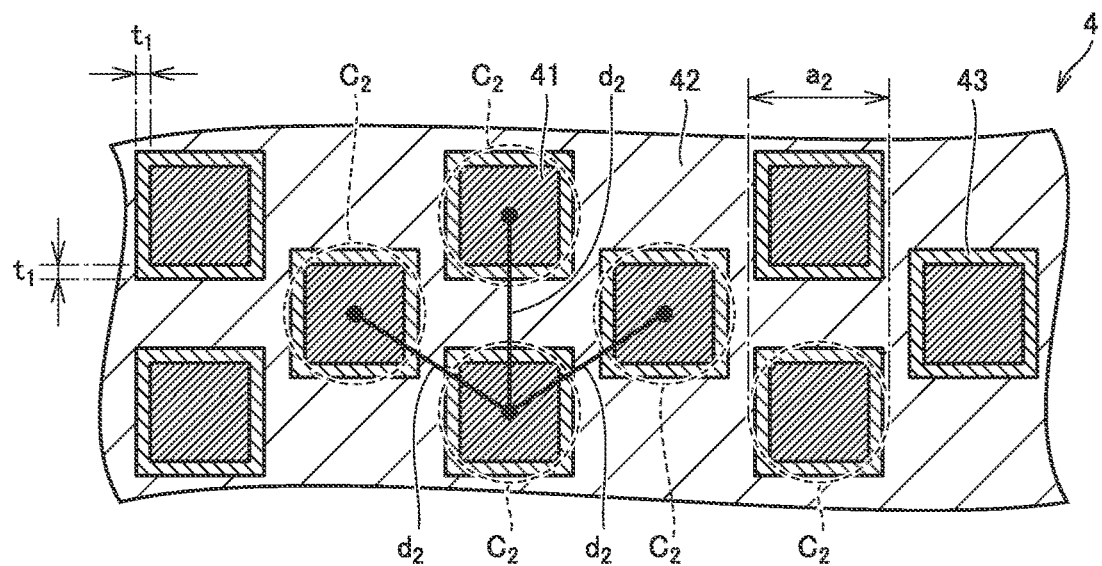
FIG. 3 is a cross-sectional view schematically showing a construction of any cross-section in a direction of thickness of the domain structure layer by way of example.

That is, referring to FIG. 3 which is a cross-sectional view schematically showing the construction of the domain structure layer in the direction of thickness, initially, any cross-section in the thickness direction of domain structure layer 4 is evaluated with a transmission electron microscope or three-dimensional atom probe tomography, and a virtual circumcircle $C_2$ is drawn for a plurality of measured first domains 41. The diameter $a_2$ of each virtual circumcircle $C_2$ is defined as the size of each first domain 41 in the direction of thickness of domain structure layer 4. In addition, each distance $d_2$ between the central point of virtual circumcircle $C_2$ in one first domain 41 and the central point of virtual circumcircle $C_2$ in each of other plurality of first domains 41 adjacent to that one first domain 41 is measured. The shortest of these straight lines $d_2$ is defined as the nearest neighbor distance of that one first domain 41 in the thickness direction of domain structure layer 4.

Then, (1) to (4) above for the size and the nearest neighbor distance in the direction of thickness of domain structure layer 4 are preferably satisfied. In this case, the effect described above can further be achieved. The size and the nearest neighbor distance in the direction of thickness of domain structure layer 4 may be the same as or different from the size and the nearest neighbor distance in the in-plane direction of domain structure layer 4 described above, respectively. With the fabrication method described later, each value in (1) to (4) above to be controlled tends to be smaller in the thickness direction.

Second Embodiment: Coating

Though a case that domain structure layer 4 has a sea-island structure has been described in the first embodiment, domain structure layer 4 is not limited to the construction above. In the present embodiment, a case that first domain 41 and second domain 42 are equal to each other in size and nearest neighbor distance will be described. In the present embodiment, differences from the first embodiment will be described and similar description will not be repeated.

Figure 4:
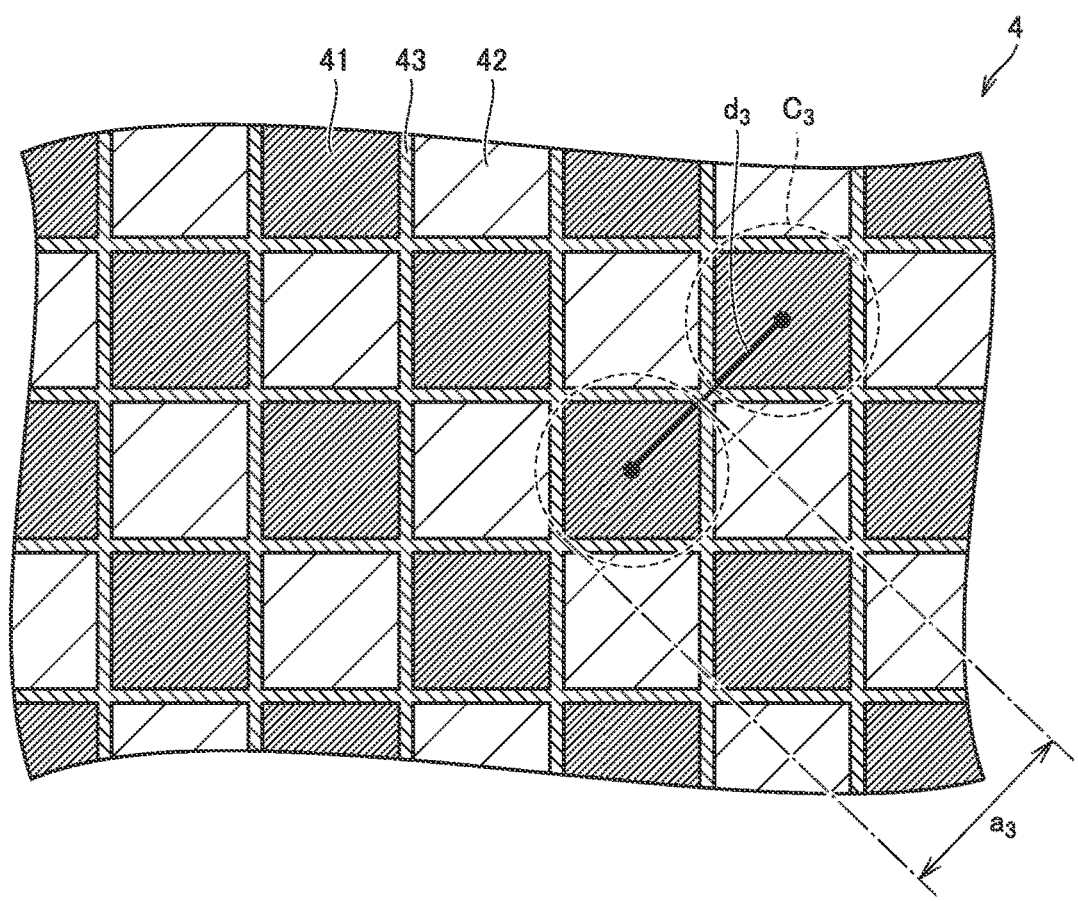
FIG. 4 is a cross-sectional view schematically showing a construction of any cross-section in the in-plane direction of the domain structure layer by way of another example.
Figure 5:
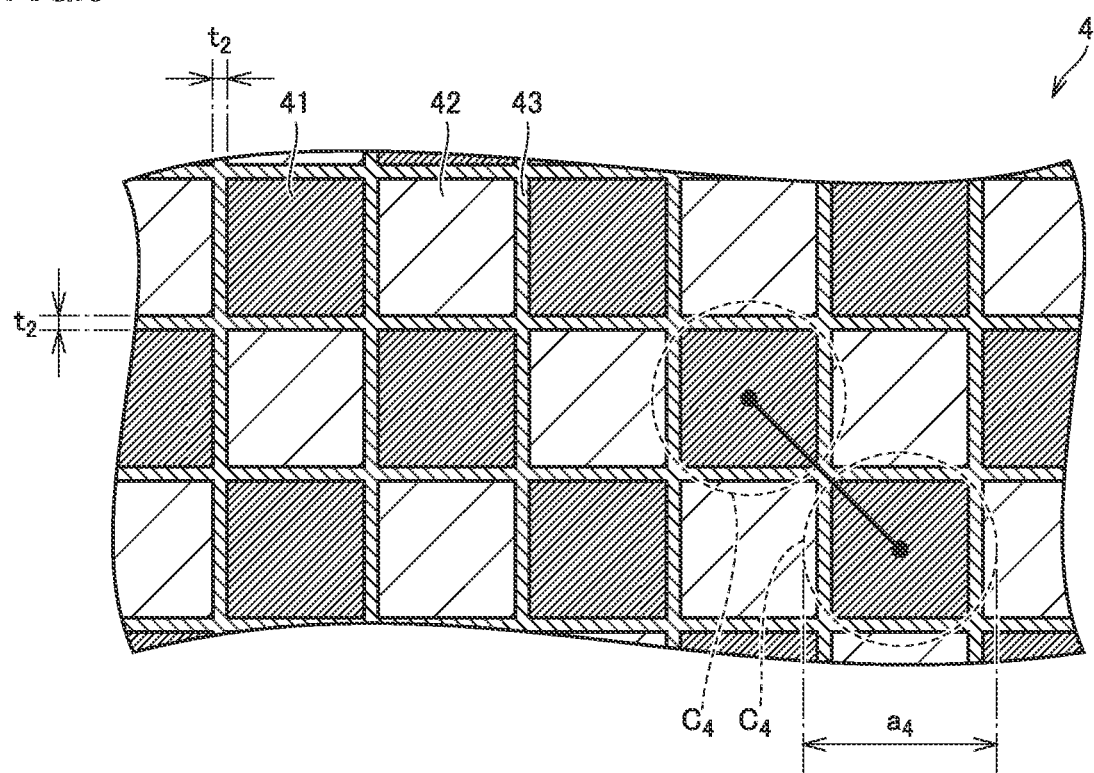
FIG. 5 is a cross-sectional view schematically showing a construction of any cross-section in the direction of thickness of the domain structure layer by way of another example.

FIG. 4 is a cross-sectional view schematically showing a construction in the in-plane direction of the domain structure layer by way of another example, and FIG. 5 is a cross-sectional view schematically showing the construction in the direction of thickness of the domain structure layer by way of another example. In the present embodiment, first domain 41 satisfies (1) to (4) above and second domain 42 also satisfies (1) to (4) above.

FIG. 4, however, shows only a virtual circumcircle $C_3$ of first domain 41 in the in-plane direction of domain structure layer 4, the diameter $a_3$ of virtual circumcircle $C_3$, and each distance $d_3$ between the central point of one virtual circumcircle $C_3$ and the central point of virtual circumcircle $C_3$ in each of a plurality of other first domains 41 adjacent to that one virtual circumcircle $C_3$. Virtual circumcircles and distances for second domain 42 are not shown. Similarly, FIG. 5 shows only a virtual circumcircle $C_4$ of first domain 41 in the direction of thickness of domain structure layer 4, the diameter $a_4$ of virtual circumcircle $C_4$, and each distance $d_4$.

According to such domain structure layer 4, since both of first domain 41 and second domain 42 are of the nanometer order and uniformly distributed, the effect resulting from the nanometer order is higher. Since the interfaces in domain structure layer 4 (a surface of contact between different compounds) also increase, strain energy in domain structure layer 4 is also higher. Therefore, coating 1 including domain structure layer 4 in the present embodiment is higher in hardness and hence higher in wear resistance also in a high-temperature environment.

Third Embodiment: Coating

Though an example in which domain structure layer 4 is constituted of first domain 41, second domain 42, and thin layer 43 has been described in the first and second embodiments, the construction of domain structure layer 4 is not limited as such. For example, in addition to first domain 41, second domain 42, and thin layer 43, a third domain, a fourth domain, . . . may further be included. In this case, thin layer 43 is preferably located between every pair of domains adjacent and different in composition, as being in contact with each of two types of adjacent domains.

For example, it is assumed that a domain structure layer has a sea-island structure constituted of first to third domains (three types of domains) and a thin layer, the first domain and the second domain is defined as an island, and the third domain is defined as the sea. In this case, the thin layer is preferably present between the first domain and the third domain and between the second domain and the third domain. Mutual diffusion of elements among all domains can thus be suppressed.

Alternatively, for example, it is assumed that a domain structure layer is constituted of first to third domains (three types of domains) and a thin layer and has a construction as seen in the second embodiment. In this case, the thin layer is preferably present between the first domain and the second domain, between the first domain and the third domain, and between the second domain and the third domain. Mutual diffusion of elements among all domains can thus be suppressed.

Fourth Embodiment: Method of Manufacturing Coating

Domain structure layer 4 according to the first embodiment and the second embodiment can be fabricated through vapor deposition in which pulsed electric power can be supplied to targets (evaporation sources) serving as respective source materials for first domain 41, second domain 42, and thin layer 43. In particular, since a film manufactured with PVD is denser, higher in hardness, and better in wear resistance and adhesiveness than a film manufactured with CVD, use of PVD is preferred.

Such PVD includes High Power Impulse Magnetron Sputtering (HiPIMS), pulsed magnetron sputtering, pulsed laser ablation, and pulsed vacuum cathodic arc deposition. Among these, HiPIMS is suitable for fabrication of domain structure layer 4, because control of an amount of supply of ions and atoms which can be supplied in response to one pulse is easy and a coating having a dense and smooth surface can be fabricated. A method of manufacturing domain structure layer 4 with HiPIMS will be described with reference to FIG. 6 by way of example of the method of manufacturing domain structure layer 4.

Figure 6:
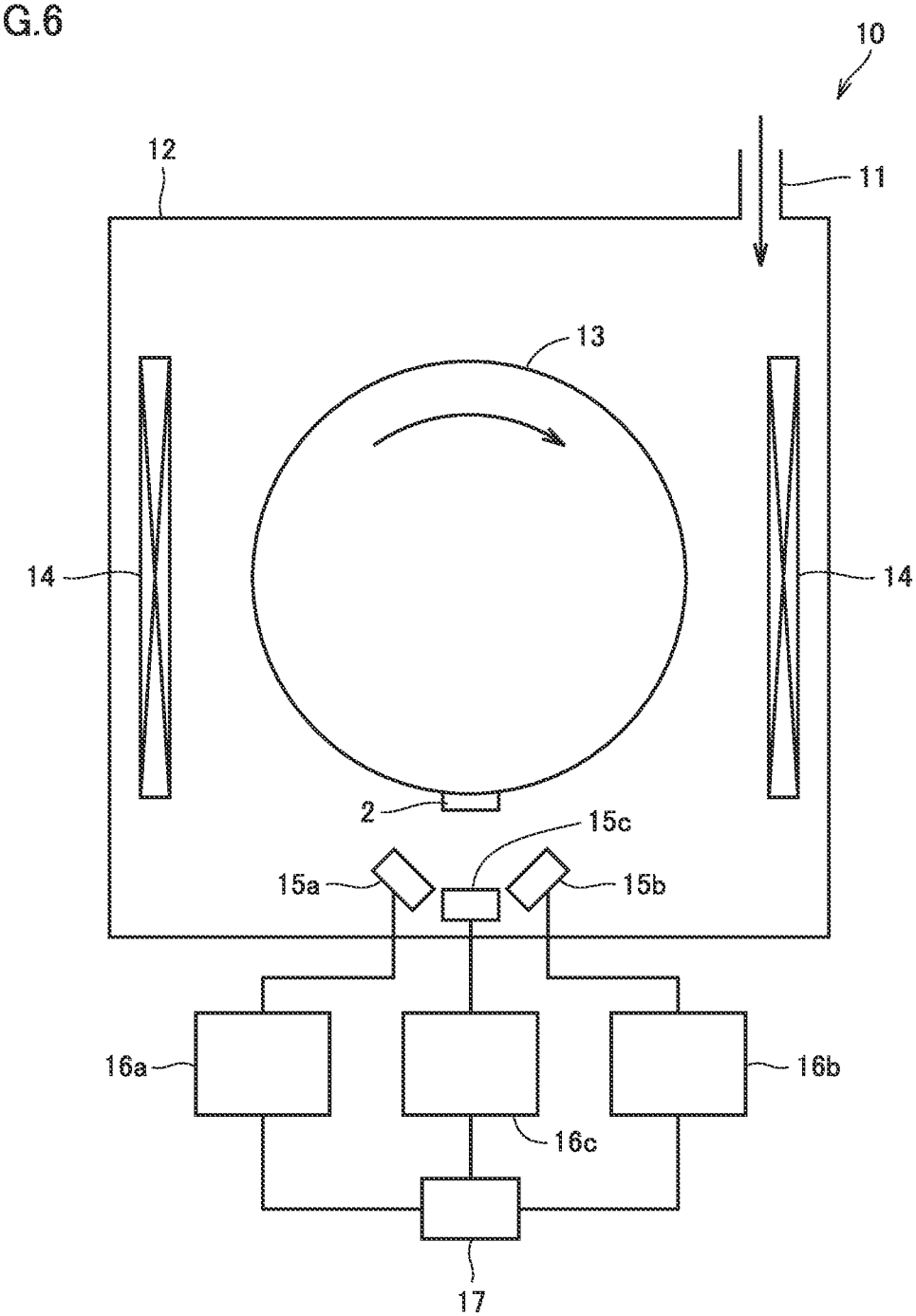
FIG. 6 is a schematic diagram showing a construction of an apparatus used for fabricating a domain structure layer.

FIG. 6 is a schematic diagram showing a construction of an apparatus used for fabricating a domain structure layer. This apparatus 10 is an HiPIMS apparatus with which HiPIMS can be performed. Referring to FIG. 6, apparatus 10 has a vacuum chamber 12 provided with a gas introduction port 11, and in vacuum chamber 12, a substrate holder 13 rotatable in a direction shown with an arrow in the figure with substrate 2 being fixed thereto and a heater 14 capable of heating substrate holder 13 and substrate 2 fixed to substrate holder 13 are arranged.

A substrate bias power supply (not shown) for applying a substrate bias voltage is connected to substrate holder 13. Direct current (DC), pulse DC, HiPIMS, or high frequency (RF) can be used as a substrate bias power supply. For a cutting tool, in particular for a tool used for intermittent cutting such as a milling tool, compressive residual stress is preferably introduced into domain structure layer 4 by enhancing ion bombardment by applying a negative bias voltage to substrate 2. By coating a substrate with the coating including domain structure layer 4 in which compressive residual stress has been introduced, chipping of the substrate such as chipping of a cutting edge can be suppressed.

The "compressive residual stress" herein refers to a type of internal stress (strain energy) present in domain structure layer 4, and to stress expressed by a "−" (minus) numeric value. Therefore, a concept of high compressive residual stress means a larger absolute value of the numeric value, and a concept of low compressive residual stress means a smaller absolute value of the numeric value.

Compressive residual stress accumulated in domain structure layer 4 as above is preferably from −0.2 to −4.0 GPa. When a value for compressive residual stress is smaller than this range, toughness of a cutting edge is insufficient and chipping is likely, and when the value for compressive residual stress exceeds this value, compressive residual stress is excessively high and a coating tends to suffer from micro peeling at the cutting edge. A more preferred value for compressive residual stress is from −0.5 to −2.0 GPa. Compressive residual stress can be measured with a $\sin^2 \psi$ method with the use of an X-ray stress measurement apparatus, a method using Raman spectroscopy, or a method using radiant light.

A substrate bias voltage affects compressive residual stress in domain structure layer 4, a hardness, and denseness of domain structure layer 4, and a value therefor is desirably from −20 to −150 V. When the voltage is lower than this range, wear resistance tends to lower due to lowering in denseness of domain structure layer 4, and when the voltage is higher than this range, compressive residual stress is excessively high. Thus, peeling of the coating from the substrate, for example, peeling of the coating at the cutting edge, is likely. A more preferred range of the substrate bias voltage is from −30 to −100 V.

Evaporation sources 15a, 15b, and 15c for supplying ions or atoms to substrate 2 are arranged in vacuum chamber 12. Evaporation sources 15a, 15b, and 15c are composed of elements serving as source materials for first domain 41, second domain 42, and thin layer 43, respectively. Normally, a metal element of the elements forming each domain is supplied from evaporation sources 15a, 15b, and 15c, and a non-metal element of elements forming each domain is introduced through gas introduction port 11. It is important that evaporation sources 15a, 15b, and 15c are arranged such that ions or atoms which have burst therefrom as a result of sputtering reach the same position on substrate holder 13.

Power supplies 16a, 16b, and 16c are electrically connected to evaporation sources 15a, 15b, and 15c, respectively, and a synchronization device 17 allowing power supplies 16a, 16b, and 16c to alternately supply pulsed electric power is electrically connected to power supplies 16a, 16b, and 16c. Thus, while power supply 16a supplies electric power, pulsed electric power can be supplied to evaporation source 15a whereas electric power cannot be supplied to evaporation sources 15b and 15c. While power supply 16b supplies electric power, pulsed electric power can be supplied to evaporation source 15b whereas electric power cannot be supplied to evaporation sources 15a and 15c. While power supply 16c supplies electric power, pulsed electric power can be supplied to evaporation source 15c whereas electric power cannot be supplied to evaporation sources 15a and 15b.

Under the control by synchronization device 17, pulsed electric power supplied alternately by power supplies 16a, 16b, and 16c supplies a pulse current in the form of a pulse train including one or more pulses to evaporation sources 15a, 15b, and 15c. Thus, ions or atoms intermittently and alternately burst out of evaporation sources 15a and 15b, and ions or atoms which have burst reach the same position on substrate holder 13.

For example, in fabricating domain structure layer 4 constituted of first domain 41 composed of AlN, second domain 42 composed of TiN, and thin layer 43 composed of SiN with the use of HiPIMS apparatus 10, HiPIMS apparatus 10 is operated as follows.

Firstly, a target composed of Al, a target composed of Ti, and a target composed of Si are attached to evaporation sources 15a, 15b, and 15c, respectively, and substrate 2 is fixed to substrate holder 13. Then, while vacuum chamber 12 is evacuated, heater 14 heats substrate 2. Then, while an inert gas such as argon gas and nitrogen gas as reaction gas are introduced through gas introduction port 11, electric power is supplied alternately from power supplies 16a, 16b, and 16c. Thus, pulsed electric power in the form of a pulse train is supplied to evaporation sources 15a, 15b, and 15c, and ions or atoms alternately burst out of evaporation sources 15a, 15b, and 15c. Ions or atoms which have burst out of evaporation sources 15a and 15b are deposited alternately on substrate 2.

Here, pulsed electric power is supplied to the evaporation sources in the order of evaporation source 15a, 15c, 15b, 15c, 15a, . . . . Thus, a period in which thin layer 43 is formed is set between a period in which first domain 41 is formed and a period in which second domain 42 is formed.

Various suitable conditions in HiPIMS are different depending on combination of materials forming domains. At least the conditions below are preferably satisfied.

First, in fabrication of domain structure layer 4, a temperature $T_s$ (K) of substrate 2 preferably satisfies a condition of $0.1 \leq T_s/T_m \leq 0.5$, with respect to a melting point $T_m$ (K) of the domain composition with the lowest melting point, among the domains forming domain structure layer 4 (in the present embodiment, first domain 41 and second domain 42). When a value for $T_s/T_m$ is smaller than this range, surface diffusion on substrate 2, of film forming species which have come to substrate 2 is insufficient and consequently a layer composed of a single solid solution tends to be obtained. Alternatively, when a value for $T_s/T_m$ is greater than this range, surface diffusion on substrate 2, of film forming species which have come to substrate 2 is excessively active and hence fabrication of a domain of the nanometer order is difficult or a layer composed of a single solid solution tends to be obtained because a condition close to a thermal equilibrium state is established. Alternatively, phase separation takes place in first domain 41 or second domain 42, or the domain structure layer itself takes on a random structure in which phase separation has taken place, and consequently, domain structure layer 4 having the aimed-at composition may not be obtained.

Secondly, in connection with evaporation sources 15a and 15b, the number of ions or atoms supplied to substrate 2 in response to one pulse train preferably corresponds to 0.1 to 15 atmic layers. When the number of ions or atoms is smaller than this range, the domain formed with each evaporation source is excessively small and characteristics as the whole domain structure layer 4 are unfavorably close to characteristics of a layer as composed of a single solid solution. On the other hand, when the number of ions or atoms is greater than this range, a domain is excessively large and it is difficult to exhibit the nanometer size effect. In connection with evaporation sources 15a and 15b, the number of ions or atoms supplied to substrate 2 in response to one pulse train more preferably corresponds to 0.1 to 10 atomic layers.

Thirdly, in connection with evaporation source 15c, the number of ions or atoms supplied to substrate 2 in response to one pulse train preferably corresponds to 0.1 to 6 atomic layers. When the number of ions or atoms is smaller than this range, thin layer 43 cannot surround the entire surface of first domain 41 (cannot be present over the entire boundary between domains) and an effect of isolation between first domain 41 and second domain 42 by thin layer 43 is unfavorably weak. On the other hand, when the number of ions or atoms is greater than this range, thin layer 43 is unfavorably too large in thickness. In connection with evaporation source 15c, the number of ions or atoms supplied to substrate 2 in response to one pulse train more preferably corresponds to 1 to 2 atomic layers.

Here, "one pulse train" means electric power intermittently supplied to a single evaporation source. Namely, "one pulse train" means a "pulse train implementing one feed of electric power" in pulsed electric power intermittently supplied to each evaporation source. This one pulse train is constituted of one or more pulses. Furthermore, the expression the number of ions or atoms supplied in response to one pulse train corresponding to 0.1 to 15 atomic layers means that the thickness achieved in assuming that a compound film formed on a substrate as a result of reaction between a reaction gas and ions or atoms which have burst out of an evaporation source in response to one pulse train (one feed of electric power) two-dimensionally grows to completely cover the substrate corresponds to 0.1 to 15 atomic layers.

For example, when domain structure layer 4 constituted of first domain 41 composed of AlN, second domain 42 composed of TiN, and thin layer 43 composed of SiN is fabricated by intermittently supplying a pulse train constituted of 5 pulses to each of an evaporation source composed of Al, an evaporation source composed of Ti, and an evaporation source composed of Si, the above-described value for the source material for first domain 41 can be calculated as follows.

Firstly, an evaporation source composed of Al and a substrate are set in vacuum chamber 12, and electric power in the form of 100 continuous pulses is continuously supplied to the evaporation source while a nitrogen gas as a reaction gas is introduced into vacuum chamber 12. Then, the thickness of the fabricated coating composed of AlN (an AlN coating) is measured. For example, when the fabricated AlN coating has a thickness of 100 Å, the AlN coating having a thickness of 1 Å (approximately 0.5 atomic layer) is fabricated per 1 pulse and the AlN coating having a thickness of 5 Å (approximately 2.5 atomic layers) is fabricated per one pulse train. Therefore, in this case, the number of ions or atoms of a source material for first domain 41 supplied to substrate 2 in response to one pulse train corresponds to approximately 2.5 atomic layers. The value described above can also be calculated for second domain 42 composed of TiN and thin layer 43 composed of SiN with the same method.

In particular, by controlling the number of ions or atoms (atomic layers) supplied in response to one pulse train, each size of first domain 41 and second domain 42 and a thickness of thin layer 43 can be controlled. For example, when evaporation source 15a is a source material for first domain 41 and evaporation source 15b is a source material for second domain 42, the number of ions or atoms (atomic layers) supplied from evaporation source 15a in response to one pulse train is made smaller than the number of ions or atoms (atomic layers) supplied from evaporation source 15b in response to one pulse train, so that domain structure layer 4 as shown in FIGS. 2 and 3 can be fabricated. Alternatively, the number of ions or atoms (atomic layers) supplied from evaporation source 15a in response to one pulse train is made substantially equal to the number of ions or atoms (atomic layers) supplied from evaporation source 15b in response to one pulse train, so that domain structure layer 4 as shown in FIGS. 4 and 5 can be fabricated.

Though other conditions are not particularly limited in the HiPIMS method above, it is, for example, preferable that the film formation conditions below are satisfied.

Pulse width (pulse time period of a single pulse within a pulse train): 0.01 to 5 ms
Frequency: 0.01 to 2 kHz
Bias voltage: −20 to −150 V
Pressure in chamber: 0.1 to 1 Pa Using the method of manufacturing a coating in the present embodiment, domain structure layer 4 satisfying (1) and (2) above or domain structure layer 4 satisfying (1) to (4) above can be fabricated.

Though fabrication of domain structure layer 4 constituted of two types of domains of first domain 41 and second domain 42 and thin layer 43 has been described above, for example, when domain structure layer 4 is constituted of three types of domains, four evaporation sources should be employed. Here, arrangement should be such that a pulse train is alternately supplied to any evaporation source and ions or atoms can be supplied to the same area on substrate holder 13.

In fabricating a domain structure layer constituted of two types of domains and thin layer 43, at least three evaporation sources, at least three pulse power supplies electrically connected to the respective evaporation sources, and one synchronization device electrically connected to the three pulse power supplies are required. In fabricating a domain structure layer constituted of three types of domains and thin layer 43, at least four evaporation sources, at least four pulse power supplies electrically connected to the respective evaporation sources, and one synchronization device electrically connected to the four pulse power supplies are required. For the purpose of reducing a time period for film formation, two or more evaporation sources for forming domains may be arranged.

Before fabricating domain structure layer 4 on substrate 2 through the HiPIMS method described above, underlying layer 3 may be provided on substrate 2 and thereafter domain structure layer 4 may be fabricated. For example, when substrate 2 is made of cemented carbide, a solid solution layer composed of a solid solution is preferably fabricated as underlying layer 3 on a surface of cemented carbide, because domain structure layer 4 tends to be fabricated to a desired construction on a surface of a solid solution layer made of single composition more uniformly than on a surface of cemented carbide which is a sintered material consisting of several different compositions.

Though composition of the solid solution layer is not particularly limited, a solid solution composed of an element for evaporation sources 15a and 15b used for forming domain structure layer 4 and an element forming a reaction gas is preferred. Specifically, when first domain 41 is composed of AlN and second domain 42 is composed of TiN, a solid solution layer composed of AlTiN is preferred. Such a solid solution layer can be fabricated by simultaneously supplying pulsed electric power to power supplies 16a and 16b to thereby simultaneously supply a pulse train to evaporation sources 15a and 15b. In this case, the solid solution layer and domain structure layer 4 can exhibit high adhesiveness to each other, and it is not necessary to separately provide an evaporation source for fabricating a solid solution layer. In addition, since a target composed of Al and a target composed of Ti are relatively inexpensive, domain structure layer 4 can inexpensively be manufactured.

As the coating according to the first embodiment and the second embodiment described above in detail and the coating manufactured with the manufacturing method according to the third embodiment are provided on the surface of the substrate, various physical properties derived from the domain structure layer can be provided to the substrate. For example, the coating having the domain structure layer excellent in hardness and wear resistance as described above can suitably be made use of for a tool or a mold. Among others, the coating having the domain structure layer excellent additionally in oxidation resistance would be useful also for an application to a tool exposed to a particularly severe environment.

EXAMPLES

Though the present invention will be described in further detail with reference to Examples below, the present invention is not limited thereto. In Examples below, an underlying layer and a domain structure layer (which may hereinafter simply also be denoted as a "structure layer" in a sense including both of the domain structure layer in the present embodiment and a structure layer in a Comparative Example) are fabricated on a surface of a substrate and a structure of the domain structure layer and physical properties were investigated.

<Study 1>

In Examples in Study 1, a domain structure layer as shown in FIGS. 2 and 3 was fabricated.

Examples 1 to 15

(Preparation of Substrate and Target)

Initially, for the purpose of checking a structure and a hardness of a coating, a test piece of which surface to be coated was mirror polished (material name: G10E, manufactured by Sumitomo Electric Industries, Ltd.) was prepared (substrate X). For the purpose of investigating the wear resistance of the coating, an insert for milling (model number: SEET13T3AGSN-G, manufactured by Sumitomo Electric Industries, Ltd.) was prepared (substrate Y). Substrate X and substrate Y were cleaned with an alkali cleaning solution.

Prepared substrate X was set to substrate holder 13 in HiPIMS apparatus 10, a target A was set as evaporation source 15a, a target B was set as evaporation source 15b, and a target C was set as evaporation source 15c. Each target had a diameter of 4 inches. Composition of targets A to C in Examples 1 to 15 is as shown in Table 1.

(Determination of the Number of Ions or Atoms per One Pulse Train)

In order to determine the number of ions or atoms (atomic layers) per 1 pulse train for each target, the following test was conducted for each target. Initially, while substrate X was heated to 450° C., the pressure in vacuum chamber 12 was lowered to 0.005 Pa. Then, Ar gas was introduced, and the pressure in vacuum chamber 12 was held at 0.8 Pa, and substrate X was cleaned with the use of an Ar ion source at a substrate bias voltage of −600 V for 30 minutes.

Then, the Ar gas was exhausted from vacuum chamber 12, and thereafter each gas was introduced such that a partial pressure in vacuum chamber 12 was set to $Ar:N_2=0.4$ Pa:0.2 Pa. Then, under film formation conditions below, a coating composed of an element for target A and N was fabricated, and the number of ions or atoms (atomic layers) per 1 pulse supplied to substrate X was calculated. Based on this result, the number of pulses included in 1 pulse train for target A was adjusted such that the number of ions or atoms per 1 pulse train attained the value shown in Table 1.

Pulse width: 0.1 ms
Pulsed electric power: 60 kW
Frequency: 1 kHz
Bias voltage: −60 V (DC power supply)

Vacuum chamber 12 was then opened, substrate X was replaced with new substrate X, the number of ions or atoms (atomic layers) per 1 pulse train for target B was calculated with the operations the same as above, and the number of pulses included in 1 pulse train was adjusted based on this result such that the number of ions or atoms per 1 pulse train for target B attained the value shown in Table 1.

For target C as well, the number of ions or atoms (atomic layers) per 1 pulse train was calculated with the operations the same as above, and the number of pulses included in 1 pulse train was adjusted based on this result such that the number of ions or atoms per 1 pulse train for target C attained the value shown in Table 1.

(Fabrication of Coating)

Then, vacuum chamber 12 was again opened, substrate X was replaced with new substrate X, and a pressure in vacuum chamber 12 was lowered to 0.005 Pa while the substrate was heated to 450° C. Then, Ar gas was introduced, the pressure in vacuum chamber 12 was held at 0.8 Pa, and substrate X was cleaned with the use of an Ar ion source at a substrate bias voltage of −600 V for 30 minutes.

Then, the Ar gas was exhausted from vacuum chamber 12, and thereafter each gas was introduced such that a partial pressure in vacuum chamber 12 was set to $Ar:N_2=0.4$ Pa:0.2 Pa. Then, under film formation conditions below, electric power was supplied simultaneously to target A and target B (that is, electric power was supplied continuously to both of target A and target B), so that a solid solution layer (a thickness: 0.1 μm) as the underlying layer was formed on the surface of substrate X. This solid solution layer is composed of a solid solution composed of elements for target A and target B and N.

Pulse width of target A: 0.1 ms
Pulse width of target B: 0.1 ms
Pulsed electric power (targets A and B): 60 kW
Frequency: 1 kHz
Bias voltage: −60 V (DC power supply)

Following the formation of the solid solution layer, the domain structure layer (thickness: 3 μm) was formed on a surface of the solid solution layer by alternately supplying electric power to targets A to C under film formation conditions below. Specifically, intermittent supply of electric power to the targets in the order of target C, target B, target C, and target A was repeated. The temperature of the substrate was maintained at 450° C. This domain structure layer was constituted of a second domain composed of an element for target A and N, a first domain composed of an element for target B and N, and a thin layer composed of an element for target C and N. Tables 1 and 2 show features of each coating.

Pulse width of target A: 0.1 ms
Pulse width of target B: 0.1 ms
Pulse width of target C: 0.1 ms
Pulsed electric power (targets A to C): 60 kW
Frequency: 1 kHz
Bias voltage: −60 V (DC power supply)

TABLE 1

| | Target A | | Target B | | Target C | | Entire Structure Layer |
|---|---|---|---|---|---|---|---|
| | Composition | Atomic layer | Composition | Atomic layer | Composition | Atomic layer | Al/Ti Ratio |
| Example 1 | Al | 1.4 | Ti | 0.5 | Si | 0.3 | 3.01 |
| Example 2 | Al | 3.3 | Ti | 2.0 | Si | 1.6 | 1.69 |
| Example 3 | Al | 4.6 | Ti | 2.6 | Si | 2.3 | 1.75 |
| Example 4 | Al | 7.0 | Ti | 4.5 | B | 4.0 | 1.55 |
| Example 5 | Al | 14.9 | Ti | 7.7 | B | 4.3 | 1.94 |
| Example 6 | Ti | 4.5 | Al | 2.7 | Si | 1.1 | 0.61 |
| Example 7 | $Al_{0.95}B_{0.05}$ | 4.5 | $Ti_{0.95}B_{0.05}$ | 3.2 | Si | 2.6 | 1.29 |
| Example 8 | $Al_{0.95}Si_{0.05}$ | 4.3 | $Ti_{0.95}Si_{0.05}$ | 2.9 | B | 2.3 | 1.31 |
| Example 9 | $Al_{0.95}W_{0.05}$ | 4.0 | $Ti_{0.95}W_{0.05}$ | 2.7 | Si | 1.7 | 1.32 |
| Example 10 | $Al_{0.95}Nb_{0.05}$ | 3.7 | $Ti_{0.95}Nb_{0.05}$ | 2.5 | Si | 1.6 | 1.33 |
| Example 11 | $Al_{0.61}Ti_{0.4}$ | 4.7 | $Al_{0.41}Ti_{0.6}$ | 2.5 | Si | 2.0 | 1.13 |
| Example 12 | $Al_{0.4}Ti_{0.6}$ | 4.1 | $Al_{0.6}Ti_{0.4}$ | 2.1 | Si | 2.0 | 0.88 |
| Example 13 | $Al_{0.5}Ti_{0.5}$ | 4.5 | Al | 3.2 | Si | 2.4 | 2.43 |
| Example 14 | Al | 4.6 | Cr | 2.6 | Si | 2.1 | — |
| Example 15 | Ti | 4.2 | Cr | 2.0 | Si | 1.7 | — |
| Comparative Example 1 | Al | 0.9 | Ti | 0.5 | Si | 0.6 | 1.66 |
| Comparative Example 2 | Al | 17.6 | Ti | 12.1 | Si | 2.8 | 1.45 |
| Comparative Example 3 | Al | 3.3 | Ti | 2.0 | — | — | 1.69 |
| Comparative Example 4 | Al | 3.3 | Ti | 2.0 | Si | 2.2 | 1.69 |

TABLE 2

| | First Domain | | | | | | |
|---|---|---|---|---|---|---|---|
| | | | Size in In-Plane Direction | | Nearest Neighbor Distance in In-Plane Direction | | Size in Thickness Direction | |
| | Composition | Crystal Structure | Average (nm) | Scatter (%) | Average (nm) | Scatter (%) | Average (nm) | Scatter (%) |
| Example 1 | TiN | c-NaCl | 1.0 | ±25 | 1.8 | ±25 | 0.4 | ±9 |
| Example 2 | TiN | c-NaCl | 2.0 | ±15 | 4.0 | ±15 | 1.1 | ±5 |
| Example 3 | TiN | c-NaCl | 3.1 | ±13 | 7.0 | ±12 | 1.5 | ±6 |
| Example 4 | TiN | c-NaCl | 5.0 | ±11 | 9.0 | ±10 | 2.4 | ±5 |
| Example 5 | TiN | c-NaCl | 9.9 | ±9 | 15.0 | ±8 | 4.7 | ±4 |
| Example 6 | AlN | c-NaCl | 3.1 | ±13 | 4.5 | ±12 | 1.5 | ±5 |
| Example 7 | $Ti_{0.95}B_{0.05}N$ | c-NaCl | 3.2 | ±12 | 6.9 | ±13 | 1.6 | ±4 |
| Example 8 | $Ti_{0.95}Si_{0.05}N$ | c-NaCl | 3.1 | ±10 | 5.1 | ±9 | 1.5 | ±4 |
| Example 9 | $Ti_{0.95}W_{0.05}N$ | c-NaCl | 3.0 | ±11 | 5.0 | ±10 | 1.4 | ±5 |
| Example 10 | $Ti_{0.95}Nb_{0.05}N$ | c-NaCl | 2.9 | ±12 | 4.9 | ±13 | 1.3 | ±4 |
| Example 11 | $Al_{0.4}Ti_{0.6}N$ | c-NaCl | 3.1 | ±13 | 6.3 | ±10 | 1.5 | ±3 |
| Example 12 | $Al_{0.6}Ti_{0.4}N$ | c-NaCl | 2.8 | ±11 | 6.8 | ±9 | 1.3 | ±3 |
| Example 13 | AlN | c-NaCl | 3.0 | ±10 | 5.9 | ±10 | 1.6 | ±4 |

TABLE 2-continued

| | | | | | | | | |
|---|---|---|---|---|---|---|---|---|
| Example 14 | CrN | c-NaCl | 2.9 | ±12 | 6.0 | ±12 | 1.5 | ±5 |
| Example 15 | CrN | c-NaCl | 2.7 | ±9 | 6.0 | ±13 | 1.3 | ±5 |
| Comparative Example 1 | TiN | c-NaCl | 0.7 | ±26 | 2.5 | ±23 | 0.3 | ±7 |
| Comparative Example 2 | TiN | c-NaCl | 12.3 | ±8 | 15.2 | ±10 | 6.2 | ±3 |
| Comparative Example 3 | TiN | c-NaCl | 2.0 | ±14 | 2.3 | ±14 | 1.1 | ±4 |
| Comparative Example 4 | TiN | c-NaCl | 2.0 | ±15 | 7.5 | ±16 | 1.1 | ±5 |

| | Second Domain | | Thin Layer | | Thickness |
|---|---|---|---|---|---|
| | Composition | Crystal Structure | Composition | Crystal Structure | (Atomic layer) |
| Example 1 | AlN | c-NaCl | SiN | c-NaCl | 1 |
| Example 2 | AlN | c-NaCl | SiN | c-NaCl | 4 |
| Example 3 | AlN | c-NaCl | SiN | c-NaCl | 8 |
| Example 4 | AlN | c-NaCl | BN | c-NaCl | 10 |
| Example 5 | AlN | h-wurtzite | BN | Amorphous | 9 |
| Example 6 | TiN | c-NaCl | SiN | c-NaCl | 2 |
| Example 7 | $Al_{0.95}B_{0.05}N$ | c-NaCl | SiN | c-NaCl | 8 |
| Example 8 | $Al_{0.95}Si_{0.05}N$ | c-NaCl | BN | c-NaCl | 5 |
| Example 9 | $Al_{0.95}W_{0.05}N$ | c-NaCl | SiN | c-NaCl | 4 |
| Example 10 | $Al_{0.95}Nb_{0.05}N$ | c-NaCl | SiN | c-NaCl | 4 |
| Example 11 | $Al_{0.6}Ti_{0.4}N$ | c-NaCl | SiN | c-NaCl | 6 |
| Example 12 | $Al_{0.4}Ti_{0.6}N$ | c-NaCl | SiN | c-NaCl | 8 |
| Example 13 | $Al_{0.5}Ti_{0.5}N$ | c-NaCl | SiN | c-NaCl | 6 |
| Example 14 | AlN | c-NaCl | SiN | c-NaCl | 6 |
| Example 15 | TiN | c-NaCl | SiN | c-NaCl | 6 |
| Comparative Example 1 | AlN | c-NaCl | SiN | c-NaCl | 4 |
| Comparative Example 2 | AlN | h-wurtzite | SiN | c-NaCl | 4 |
| Comparative Example 3 | AlN | c-NaCl | — | — | — |
| Comparative Example 4 | AlN | c-NaCl | SiN | c-NaCl | 12 |

Table 1 shows composition of targets A to C, the number of ions or atoms (atomic layers) per 1 pulse train, and the Al/Ti ratio in the entire structure layer. Composition and the Al/Ti ratio of the entire structure layer were measured with an X-ray photoelectron spectrometer. The structure layer in each of Examples 1 to 15 is the domain structure layer described above.

Table 2 shows composition and crystal structure of the first domain, the second domain, and the thin layer. "c-NaCl" in the field of crystal structure means crystal structure of the cubic NaCl type, "h-wurtzite" means crystal structure of a hexagonal wurtzite type, and "amorphous" means being amorphous rather than crystalline.

Through the use of 3D atom probe tomography, the structure layer could be confirmed to consist of first domains, second domains, and thin layers whose compositions differed. Furthermore, that the structure layer consisted of first domains, second domains, and thin layers whose compositions differed could also be confirmed using the following procedure. Firstly, a sample of the domain structure layer showing the cross-section in the in-plane direction as well as a sample of the domain structure layer showing the cross-section in the thickness direction were prepared. Then, using mechanical and ion milling, a measured portion of each sample was thinned to a thickness (the thickness in the direction normal to the cross section) from 5 nm to 20 nm or smaller, before being measured. The samples were then imaged using a transmission electron microscope in the HAADF-STEM (High-angle Annular Dark Field Scanning Transmission Electron Microscopy) mode. The differing compositions of the first domains, the second domains, and the thin layers could be confirmed by the differing contrast in the HAADF-STEM images.

The crystal structure of each domain could be confirmed using the nanobeam electron diffraction method of the transmission electron microscope. Furthermore, using a high resolution transmission electron microscope to image the above samples with atomic resolution, it could be confirmed that either of the first domain and the second domain had the cubic NaCl crystal structure. In case the first domain consists of the cubic NaCl crystal structure and the second domain consists of the hexagonal wurtzite crystal structure, the electron diffraction patterns of the cubic NaCl crystal structure and of the hexagonal wurtzite crystal structure were seen overlaid in the electron diffraction measurement. Due to this effect, the crystal structures could be confirmed by acquiring dark field images for the diffraction spots of the cubic NaCl crystal structure as well as the diffraction spots of the hexagonal wurtzite crystal structure and comparing the dark field images to the HAADF-STEM images.

Since the thin layer was extremely thin, that is, it had a thickness as small as several atomic layers, it was sometimes difficult to observe crystal structure with the nanobeam electron diffraction method. In this case, crystal structure was confirmed by observing a lattice image with a high resolution transmission electron microscope.

The composition of the first domains, the second domains, and the thin layers in the above samples was analyzed using the line scan function of a transmission electron microscope equipped with an energy dispersive X-ray spectrometer.

Table 2 shows the average value of the size in the in-plane direction of the first domain and deviation (scatter) from the average value, the nearest neighbor distance in the in-plane direction of the first domain and deviation (scatter) from the average value, and the average value of the size in the direction of thickness and deviation (scatter) from the average value. For example, though scatter in size in the in-plane direction is denoted as "±25" in Example 1, this means that 95 or more first domains of 100 first domains observed in any cross-section in the in-plane direction have the size within the range of ±25% from the average value of the size of (100) first domains in the in-plane direction. Each size and each scatter were calculated with the use of a transmission electron microscope.

The average size in the in-plane direction of the above mentioned first domains as well as the relative scatter around this average value were evaluated as described below. Firstly, as described above, the samples were thinned to a thickness in the cross-section in the in-plane direction of 10 nm or smaller before being imaged using the HAADF-STEM mode of a transmission electron microscope. Depending on the size of the first domains, the image size was chosen to between 20 nm×20 nm and 50 nm×50 nm. The brightness and contrast were adjusted so as to obtain a clear contrast of the first domains and the second domains. Then, image analysis software (ImageJ) was used to determine the size and the number of first domains in the HAADF-STEM images and based on this histograms were constructed. Here, the border between first domains and second domains was determined visually, thereby also determining the virtual circumcircle of the first domains.

There have been cases when the above histograms have shown a plurality of peaks. The HAADF-STEM image being a transmission image, this is due to the imaging of two or more different first domains overlapping in the thickness direction of the sample. Imaging two or more different first domains overlapping in the thickness direction of the sample will yield a domain size larger than that of a single first domain, resulting in a histogram with a plurality of peaks. Therefore, in a histogram with a plurality of peaks, the average size and scatter of the first domains must be determined using the smallest peak in order to extract information from single domains only. In case the smallest peak and the second peak overlap, domains with sizes exceeding those in the valley between the two histogram peaks should be ignored when determining the average and scatter values.

For the same reason, when determining the average value of the nearest neighbor distance in the in-plane direction of the first domains as well as the scatter relative to this value, only single first domains should be used. Furthermore, as to the average size and the scatter relative to this value in the thickness direction, HAADF-STEM images of samples including the cross-section in the thickness direction were used to determine the height of the first domains in the thickness direction.

As it may happen that some of the first domains become truncated in the polishing step, when determining the average size of the first domains and the scatter relative to this value as well as the nearest neighbor distance and the scatter relative to this value from HAADF-STEM images, these first domains may appear smaller than their actual size.

Taking the background of the lighter domains to be 0% contrast and the typical contrast of the darker domains to be 100% contrast, if the first domains are lighter, such as in Examples 1-5, 7-11, 14 and 15, domains showing >50% of the contrast should be discarded, and if the first domains are darker, such as in Examples 6, 12 and 13, domains showing <50% of the contrast should be discarded before the image analysis.

A thickness of the thin layer in Table 2 was measured in a lattice image obtained by observation with a high resolution transmission electron microscope, of a measurement sample of which thickness in the cross-section in the direction of thickness was thinned to 10 nm or smaller as above. Table 2 shows a thickness of the thin layer as an average value calculated based on measurement at 100 locations.

Comparative Examples 1 to 4

In Comparative Examples 1, 2, and 4, a coating was fabricated with a method the same as in Example 1 except that the number of ions or atoms per 1 pulse train was changed as shown in Table 1. In Comparative Example 3, a coating was fabricated with a method the same as in Example 2 except that electric power was not supplied to target C. Tables 1 and 2 also show various features in Comparative Examples 1 to 4.

[Hardness of Coating]

An indentation hardness of the structure layer of each obtained coating was measured by using a nanoindenter ("ENT-1100a" manufactured by Elionix Inc.) and pressing an indenter into the structure layer at a load of 1 g in the direction of normal to a surface of the coating. Table 3 shows results of a hardness of each coating in Examples 1 to 15 and Comparative Examples 1 to 4.

[Wear Resistance of Coating]

A coating according to each of Examples 1 to 15 and Comparative Examples 1 to 4 was fabricated on the surface of substrate Y with the method the same as above. Thus, an insert having a coating formed on the surface of the insert for milling was fabricated. Each obtained insert was subjected to a milling cutting test under two conditions below to measure the wear width of a flank face of the insert. A cutting test B was higher in cutting speed and temperature of a cutting edge of the insert than a cutting test A. Table 3 shows results.

(Cutting Test A)

Work material: SCM435 (85 mm wide×300 mm long)

Cutting speed: 230 m/min.

Feed: 0.3 mm/revolution

Depth of cut: 2.0 mm

Cutting oil: none (dry cutting)

Distance of cutting: 3600 mm

Cutting pass: 12

Cutter: WGC4100R (manufactured by Sumitomo Electric Hardmetal Corporation)

One insert was attached to the cutter.

(Cutting Test B)

Work material: SCM435 (85 mm wide×300 mm long)

Cutting speed: 400 m/min.

Feed: 0.3 mm/revolution

Depth of cut: 2.0 mm

Cutting oil: none (dry cutting)

Distance of cutting: 1800 mm

Cutting pass: 6
Cutter: WGC4100R (manufactured by Sumitomo Electric Hardmetal Corporation)
One insert was attached to the cutter.

TABLE 3

|  | Characteristics (Physical Properties) Hardness (mgf/μm$^2$) | Cutting Test A 230 m/min. Wear Width (mm) | Cutting Test B 400 m/min. Wear Width (mm) |
|---|---|---|---|
| Example 1 | 6650 | 0.065 | 0.085 |
| Example 2 | 7064 | 0.058 | 0.079 |
| Example 3 | 7304 | 0.056 | 0.078 |
| Example 4 | 6908 | 0.060 | 0.081 |
| Example 5 | 6185 | 0.072 | 0.095 |
| Example 6 | 7403 | 0.056 | 0.076 |
| Example 7 | 7509 | 0.053 | 0.075 |
| Example 8 | 7408 | 0.054 | 0.074 |
| Example 9 | 7571 | 0.053 | 0.072 |
| Example 10 | 7364 | 0.057 | 0.075 |
| Example 11 | 6460 | 0.068 | 0.090 |
| Example 12 | 6289 | 0.070 | 0.091 |
| Example 13 | 7862 | 0.052 | 0.071 |
| Example 14 | 7403 | 0.054 | 0.074 |
| Example 15 | 6459 | 0.068 | 0.088 |
| Comparative Example 1 | 3951 | 0.132 | 0.166 |
| Comparative Example 2 | 3069 | 0.185 | 0.227 |
| Comparative Example 3 | 6420 | 0.066 | 0.218 |
| Comparative Example 4 | 4258 | 0.119 | 0.152 |

Table 3 shows an indentation hardness of the structure layer in the field of "hardness" and a wear width of the coating (the flank face) of the insert before and after the milling cutting test in the field of "wear width". A higher value for the hardness means a higher hardness of the coating, and a smaller wear width means that an amount of wear of the coating is small and wear resistance is high.

[Discussion]

Referring to Tables 1 to 3, the structure layer in each of Examples 1 to 15 was a domain structure layer satisfying the features (3) and (4) above in addition to the features (1) and (2) above. The coating having this domain structure layer had a very high hardness not lower than 6000 mgf/μm$^2$. Each coating had a wear width not greater than 0.1 mm and had high wear resistance.

In contrast, the structure layer in each of Comparative Examples 1 and 2 did not satisfy at least (1) above. The coating having this structure layer was lower in hardness and wear resistance than the coatings in Examples 1 to 15.

It was considered in this connection that, in Comparative Example 1, the size of the first domain was smaller than (1), and therefore the structure layer had a physical property like a solid solution as a whole and consequently the hardness was substantially as high as that of the conventional AlTiN solid solution. It was considered that, in Comparative Example 2, the size of the first domain was greater than (1), and therefore the nanometer size effect and accumulation of strain energy were not obtained or were insufficient. The second domain having a crystal structure of the hexagonal wurtzite type also seemed to also be relevant to low characteristics of Comparative Example 2.

In Comparative Example 3, the pulse current was not supplied to target C and no thin layer was present. The coating in Comparative Example 3 was lower in hardness than in Example 2. A wear width in cutting test A was not greater than 0.1 mm, however, wear resistance was low in cutting test B in which a temperature of a cutting edge of the insert was high. This may be because a hardness at a high temperature was low due to absence of the thin layer.

Comparative Example 4 did not satisfy at least (2) above. The coating in Comparative Example 4 was low in hardness and also low in wear resistance.

<Study 2>

In Examples in Study 2, the domain structure layer as shown in FIGS. 4 and 5 was fabricated.

Examples 16 to 29 and Comparative Examples 5 to 8

A coating was fabricated on the surface of substrate X and substrate Y in Examples 16 to 29 and Comparative Examples 5 to 8 with the method the same as in Examples in Study 1 by forming targets A to C of elements shown in Table 4 and adjusting the number of ions or atoms (atomic layers) per 1 pulse train as shown in

TABLE 4

In Comparative Example 7, electric power was not supplied to target C as in Comparative Example 3. The number of ions or atoms per 1 pulse train for targets A to C was controlled by controlling the number of pulses included in 1 pulse train as a film formation condition. Tables 4 and 5 show features of each coating and Table 6 shows physical properties of each coating. The methods for measuring each property are the same as in Study 1.

|  | Target A | | Target B | | Target C | | Entire Structure |
|---|---|---|---|---|---|---|---|
|  | Composition | Atomic layer | Composition | Atomic layer | Composition | Atomic layer | Layer Al/Ti Ratio |
| Example 16 | Al | 1.2 | Ti | 1.2 | Si | 0.6 | 1.03 |
| Example 17 | Al | 2.9 | Ti | 2.8 | Si | 2.0 | 1.03 |
| Example 18 | Al | 3.6 | Ti | 3.5 | Si | 2.8 | 1.03 |
| Example 19 | Al | 5.6 | Ti | 5.4 | B | 4.4 | 1.03 |
| Example 20 | Al | 12.1 | Ti | 11.8 | B | 6.5 | 1.03 |
| Example 21 | Al$_{0.95}$B$_{0.05}$ | 3.9 | Ti$_{0.95}$B$_{0.05}$ | 3.8 | Si | 1.4 | 0.93 |
| Example 22 | Al$_{0.95}$Si$_{0.05}$ | 3.6 | Ti$_{0.95}$Si$_{0.05}$ | 3.5 | B | 3.5 | 0.93 |
| Example 23 | Al$_{0.95}$W$_{0.05}$ | 3.6 | Ti$_{0.95}$W$_{0.05}$ | 3.5 | B | 2.5 | 0.93 |
| Example 24 | Al$_{0.95}$Nb$_{0.05}$ | 4.1 | Ti$_{0.95}$Nb$_{0.05}$ | 4.0 | Si | 2.5 | 0.93 |
| Example 25 | Al$_{0.6}$Ti$_{0.4}$ | 3.4 | Al$_{0.4}$Ti$_{0.6}$ | 3.3 | Si | 1.8 | 1.00 |
| Example 26 | Al$_{0.4}$Ti$_{0.6}$ | 3.3 | Al$_{0.6}$Ti$_{0.4}$ | 3.4 | Si | 2.4 | 1.00 |
| Example 27 | Al$_{0.5}$Ti$_{0.5}$ | 3.6 | Al | 3.6 | Si | 2.7 | 3.03 |
| Example 28 | Al | 3.6 | Cr | 3.6 | Si | 2.5 | — |
| Example 29 | Ti | 3.3 | Cr | 3.4 | Si | 2.3 | — |

TABLE 4-continued

In Comparative Example 7, electric power was not supplied to target C as in Comparative Example 3. The number of ions or atoms per 1 pulse train for targets A to C was controlled by controlling the number of pulses included in 1 pulse train as a film formation condition. Tables 4 and 5 show features of each coating and Table 6 shows physical properties of each coating. The methods for measuring each property are the same as in Study 1.

| | Target A | | Target B | | Target C | | Entire Structure |
|---|---|---|---|---|---|---|---|
| | Composition | Atomic layer | Composition | Atomic layer | Composition | Atomic layer | Layer Al/Ti Ratio |
| Comparative Example 5 | Al | 0.7 | Ti | 0.7 | Si | 0.7 | 1.03 |
| Comparative Example 6 | Al | 20.6 | Ti | 20.0 | Si | 3.9 | 1.03 |
| Comparative Example 7 | Al | 2.9 | Ti | 2.8 | — | — | 1.03 |
| Comparative Example 8 | Al | 2.9 | Ti | 2.8 | Si | 2.6 | 1.03 |

TABLE 5

| | | | First Domain | | | | | |
|---|---|---|---|---|---|---|---|---|
| | | | Size in In-Plane Direction | | Nearest Neighbor Distance in In-Plane Direction | | Size in Thickness Direction | |
| | Composition | Crystal Structure | Average (nm) | Scatter (%) | Average (nm) | Scatter (%) | Average (nm) | Scatter (%) |
| Example 16 | TiN | c-NaCl | 1.0 | ±24 | 1.4 | ±24 | 0.5 | ±8 |
| Example 17 | TiN | c-NaCl | 2.0 | ±15 | 3.7 | ±15 | 1.2 | ±5 |
| Example 18 | TiN | c-NaCl | 2.9 | ±12 | 6.3 | ±13 | 1.5 | ±6 |
| Example 19 | TiN | c-NaCl | 4.8 | ±10 | 8.2 | ±11 | 2.3 | ±4 |
| Example 20 | TiN | c-NaCl | 10.0 | ±8 | 13.4 | ±9 | 5.0 | ±5 |
| Example 21 | $Ti_{0.95}B_{0.05}N$ | c-NaCl | 3.2 | ±11 | 4.1 | ±11 | 1.6 | ±5 |
| Example 22 | $Ti_{0.95}Si_{0.05}N$ | c-NaCl | 2.8 | ±12 | 6.2 | ±12 | 1.5 | ±6 |
| Example 23 | $Ti_{0.95}W_{0.05}N$ | c-NaCl | 3.2 | ±9 | 4.9 | ±10 | 1.5 | ±5 |
| Example 24 | $Ti_{0.95}Nb_{0.05}N$ | c-NaCl | 2.7 | ±10 | 4.4 | ±9 | 1.7 | ±4 |
| Example 25 | $Al_{0.4}Ti_{0.6}N$ | c-NaCl | 3.3 | ±10 | 5.0 | ±12 | 1.4 | ±4 |
| Example 26 | $Al_{0.6}Ti_{0.4}N$ | c-NaCl | 3.0 | ±9 | 6.0 | ±11 | 1.4 | ±5 |
| Example 27 | AlN | c-NaCl | 3.1 | ±11 | 6.5 | ±10 | 1.5 | ±4 |
| Example 28 | CrN | c-NaCl | 3.0 | ±10 | 5.6 | ±9 | 1.5 | ±5 |
| Example 29 | CrN | c-NaCl | 3.1 | ±11 | 5.7 | ±11 | 1.4 | ±4 |
| Comparative Example 5 | TiN | c-NaCl | 0.6 | ±27 | 2.3 | ±23 | 0.3 | ±9 |
| Comparative Example 6 | TiN | c-NaCl | 14.8 | ±5 | 16.5 | ±11 | 8.5 | ±5 |
| Comparative Example 7 | TiN | c-NaCl | 2.0 | ±14 | 2.0 | ±14 | 1.2 | ±5 |
| Comparative Example 8 | TiN | c-NaCl | 2.0 | ±15 | 7.2 | ±16 | 1.2 | ±4 |

| | Second Domain | | Thin Layer | | Thickness |
|---|---|---|---|---|---|
| | Composition | Crystal Structure | Composition | Crystal Structure | (Atomic layer) |
| Example 16 | AlN | c-NaCl | SiN | c-NaCl | 1 |
| Example 17 | AlN | c-NaCl | SiN | c-NaCl | 4 |
| Example 18 | AlN | c-NaCl | SiN | c-NaCl | 8 |
| Example 19 | AlN | c-NaCl | BN | c-NaCl | 10 |
| Example 20 | AlN | h-wurtzite | BN | Amorphous | 10 |
| Example 21 | $Al_{0.95}B_{0.05}N$ | c-NaCl | SiN | c-NaCl | 2 |
| Example 22 | $Al_{0.95}Si_{0.05}N$ | c-NaCl | BN | c-NaCl | 8 |
| Example 23 | $Al_{0.95}W_{0.05}N$ | c-NaCl | BN | c-NaCl | 5 |
| Example 24 | $Al_{0.95}Nb_{0.05}N$ | c-NaCl | SiN | c-NaCl | 4 |
| Example 25 | $Al_{0.6}Ti_{0.4}N$ | c-NaCl | SiN | c-NaCl | 4 |
| Example 26 | $Al_{0.4}Ti_{0.6}N$ | c-NaCl | SiN | c-NaCl | 7 |
| Example 27 | $Al_{0.5}Ti_{0.5}N$ | c-NaCl | SiN | c-NaCl | 8 |

TABLE 5-continued

| | | | | | |
|---|---|---|---|---|---|
| Example 28 | AlN | c-NaCl | SiN | c-NaCl | 6 |
| Example 29 | TiN | c-NaCl | SiN | c-NaCl | 6 |
| Comparative Example 5 | AlN | c-NaCl | SiN | c-NaCl | 4 |
| Comparative Example 6 | AlN | h-wurtzite | SiN | c-NaCl | 4 |
| Comparative Example 7 | AlN | c-NaCl | — | — | — |
| Comparative Example 8 | AlN | c-NaCl | SiN | c-NaCl | 12 |

TABLE 6

| | Characteristics (Physical Properties) Hardness (mgf/μm²) | Cutting Test A 230 m/min. Wear Width (mm) | Cutting Test B 400 m/min. Wear Width (mm) |
|---|---|---|---|
| Example 16 | 6400 | 0.067 | 0.091 |
| Example 17 | 6842 | 0.060 | 0.080 |
| Example 18 | 7244 | 0.058 | 0.077 |
| Example 19 | 6696 | 0.065 | 0.085 |
| Example 20 | 6145 | 0.071 | 0.096 |
| Example 21 | 7392 | 0.055 | 0.077 |
| Example 22 | 7315 | 0.057 | 0.078 |
| Example 23 | 7520 | 0.053 | 0.073 |
| Example 24 | 7295 | 0.056 | 0.076 |
| Example 25 | 6457 | 0.066 | 0.090 |
| Example 26 | 6323 | 0.070 | 0.091 |
| Example 27 | 7942 | 0.051 | 0.070 |
| Example 28 | 7214 | 0.056 | 0.079 |
| Example 29 | 6635 | 0.065 | 0.088 |
| Comparative Example 5 | 3782 | 0.141 | 0.176 |
| Comparative Example 6 | 3148 | 0.181 | 0.223 |
| Comparative Example 7 | 6394 | 0.065 | 0.220 |
| Comparative Example 8 | 4196 | 0.123 | 0.155 |

[Discussion]

Referring to Tables 4 to 6, the structure layer in each of Examples 16 to 29 was the domain structure layer satisfying (3) and (4) above in addition to (1) and (2) above.

In the structure layer in each of Examples 16 to 29, the first domain and the second domain were equal to each other in size. This is because the number of ions or atoms per 1 pulse train for target B supplied for fabrication of the first domain was close to the number of ions or atoms per 1 pulse train for target A supplied for fabrication of the second domain. It was confirmed with a transmission electron microscope that the structure layer in each of Examples 16 to 29 had a structure in which the first domain and the second domain were alternately stacked with the thin layer being interposed as shown in FIGS. 4 and 5.

Referring to Table 6, the coating in each of Examples 16 to 29 had a very high hardness not lower than 6000 mgf/μm². Each coating had a wear width not greater than 0.1 mm and had high wear resistance.

In contrast, the structure layer in each of Comparative Examples 5 and 6 did not satisfy at least (1) above. The coating having this structure layer was lower in hardness and wear resistance than the coatings in Examples 16 to 29.

It was considered in this connection that, in Comparative Example 5, the size of the first domain was smaller than (1), and therefore the structure layer had a physical property like a solid solution as a whole and consequently the hardness was substantially as high as that of the conventional AlTiN solid solution. It was considered that, in Comparative Example 6, the size of the first domain was greater than (1), and therefore the nanometer size effect and accumulation of strain energy were not obtained or were insufficient. The second domain having crystal structure of the hexagonal wurtzite type seemed to also be relevant to low characteristics of Comparative Example 6.

In Comparative Example 7, the pulse current was not supplied to target C and no thin layer was present. The coating in Comparative Example 7 was lower in hardness than in Example 17. This may be because, although a wear width in cutting test A was not greater than 0.1 mm, in cutting test B in which a temperature of a cutting edge of the insert was high, the thin layer was not present and hence stability at a high temperature was low and wear resistance was low.

Comparative Example 8 did not satisfy at least (2) above. The coating in Comparative Example 8 was low in hardness and also low in wear resistance.

It should be understood that the embodiments disclosed herein are illustrative and non-restrictive in every respect. The scope of the present invention is defined by the terms of the claims, rather than the embodiments above, and is intended to include any modifications within the scope and meaning equivalent to the terms of the claims.

REFERENCE SIGNS LIST

1 coating; 2 substrate; 3 underlying layer; 4 domain structure layer; 41 first domain; 42 second domain; 43 thin layer; $C_1$, $C_2$, $C_3$, $C_4$ virtual circumcircle; 10 apparatus; 11 gas introduction port; 12 vacuum chamber; 13 substrate holder; 14 heater; 15a, 15b, 15c evaporation source; 16a, 16b, 16c power supply; and 17 synchronization device.

The invention claimed is:

1. A coating located on a surface of a substrate, comprising:
   one or more layers,
   at least one of the layers being a domain structure layer constituted of two or more domains different in composition and a thin layer different in composition from each of the domains,
   the thin layer being located between any one domain and any another domain and in contact with the domains,
   a first domain which is one of the two or more domains and a second domain which is another one of the two or more domains, each of the first domain and the second domain being composed of at least one element selected from the group consisting of Al, B, Si, and elements of group 4, 5, 6 in the periodic table and at least one element selected from the group consisting of B, O, C, and N,
   the thin layer being composed of at least one element selected from B and Si and at least one element selected from B, O, C, and N, a plurality of the first domains being present in the domain structure layer,
when a size of each first domain in an in-plane direction of the domain structure layer is defined as a diameter of a virtual circumcircle in contact with the each first domain, an average value of the size of the each first domain being not smaller than 1 nm and not greater than 10 nm, and
a thickness of the thin layer in a direction of thickness of the domain structure layer being not less than 1 atomic layer and not more than 10 atomic layers.

2. The coating according to claim 1, wherein
the thin layer is located between every pair of domains adjacent and different in composition, as being in contact with each of two types of adjacent domains.

3. The coating according to claim 1, wherein
95% or more of the first domains has a size in a range of not more than ±25% of the average value of the size.

4. The coating according to claim 1, wherein
when a nearest neighbor distance of the each first domain in the in-plane direction of the domain structure layer is defined as a length of a shortest straight line connecting a center of the circumcircle with a center of another circumcircle adjacent to the circumcircle, an average value of the nearest neighbor distance of the each first domain is not smaller than 1 nm and not greater than 15 nm, and
95% or more of the first domains has a nearest neighbor distance in a range of not more than ±25% of the average value of the nearest neighbor distance.

5. The coating according to claim 1, wherein
the domain structure layer is constituted of the first domain, the second domain, and the thin layer.

6. The coating according to claim 1, wherein
one of the first domain and the second domain is composed of a nitride containing at least Al but not containing Ti and the other of the first domain and the second domain is composed of a nitride containing at least Al and Ti.

7. The coating according to claim 6, wherein
one of the first domain and the second domain is composed of AlN and the other of the first domain and the second domain is composed of $Al_xTi_{1-x}N$, where an atomic ratio Al/Ti between Al and Ti in the $Al_xTi_{1-x}N$ is not lower than 1 and not higher than 1.5.

8. The coating according to claim 1, wherein
one of the first domain and the second domain is composed of a nitride containing at least Al but not containing Ti and the other of the first domain and the second domain is composed of a nitride containing at least Ti but not containing Al.

9. The coating according to claim 8, wherein
one of the first domain and the second domain is composed of AlN and the other of the first domain and the second domain is composed of TiN.

10. The coating according to claim 1, wherein
an atomic ratio Al/Ti between Al and Ti in entire the domain structure layer exceeds 1.5.

11. The coating according to claim 1, wherein
the first domain and the second domain are composed of a nitride containing at least Al and Ti, and
an atomic ratio Al/Ti between Al and Ti in one of the first domain and the second domain is not lower than 1 and an atomic ratio Al/Ti between Al and Ti in the other of the first domain and the second domain is lower than 1.

12. The coating according to claim 1, wherein
the first domain, the second domain, and the thin layer are crystalline.

13. The coating according to claim 1, wherein
the first domain, the second domain, and the thin layer respectively have cubic crystal structures.

14. The coating according to claim 1, wherein
the thin layer is composed of SiN.

15. The coating according to claim 1, wherein
the thin layer is composed of BN.

16. The coating according to claim 1, wherein
a plurality of the second domains are present in the domain structure layer, and
when a size of each second domain in the in-plane direction of the domain structure layer is defined as a diameter of a virtual circumcircle in contact with the each second domain, an average value of the size of the each second domain is not smaller than 1 nm and not greater than 10 nm.

17. The coating according to claim 1, wherein
95% or more of the second domains has a size in a range of not more than ±25% of the average value of the size.

18. The coating according to claim 1, wherein
when a nearest neighbor distance of the each second domain in the in-plane direction of the domain structure layer is defined as a length of a shortest straight line connecting a center of the circumcircle with a center of another circumcircle adjacent to the circumcircle,
an average value of the nearest neighbor distance of the each second domain is not smaller than 1 nm and not greater than 15 nm, and
95% or more of the second domains has a nearest neighbor distance in a range of not more than ±25% of the average value of the nearest neighbor distance.

* * * * *